US009177981B2

(12) United States Patent
Nishizawa

(10) Patent No.: US 9,177,981 B2

(45) Date of Patent: Nov. 3, 2015

(54) SOLID-STATE IMAGING DEVICE HAVING A METALLIC PAD PERIPHERY GUARD RING

(75) Inventor: Kenichi Nishizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 316 days.

(21) Appl. No.: 13/362,731

(22) Filed: Jan. 31, 2012

(65) Prior Publication Data

US 2012/0217374 A1 Aug. 30, 2012

(30) Foreign Application Priority Data

Feb. 28, 2011 (JP) ................................ 2011-041321

(51) Int. Cl.
*H01L 27/146* (2006.01)

(52) U.S. Cl.
CPC .... *H01L 27/14618* (2013.01); *H01L 27/14636* (2013.01); *H01L 27/14683* (2013.01); *H01L 27/1464* (2013.01); *H01L 27/14621* (2013.01); *H01L 27/14627* (2013.01)

(58) Field of Classification Search
CPC ....... H04N 3/155; H04N 5/335; H04N 5/225; H01L 31/0203; H01L 31/0232; H01L 25/0657; H01L 2924/15311; H01L 2224/48091; H01L 2924/01079; H01L 25/105; H01L 2924/01078
USPC ............... 250/208.1, 239; 257/686, 690, 692, 257/499, 433, 409, 459, 508, 774, 777, 431, 257/432, 484, 620, E21.596, E21.599; 385/8, 12; 438/48, 54, 64, 65, 69, 570, 438/629, 637
See application file for complete search history.

(56) References Cited

U.S. PATENT DOCUMENTS

| | | | | |
|---|---|---|---|---|
| 6,498,089 | B2 * | 12/2002 | Komada | 438/618 |
| 7,288,799 | B2 * | 10/2007 | Saigoh et al. | 257/127 |
| 7,714,403 | B2 * | 5/2010 | Lee et al. | 257/432 |
| 2009/0001515 | A1 * | 1/2009 | Yamagata | 257/532 |
| 2009/0189256 | A1 * | 7/2009 | Yoshimura et al. | 257/621 |
| 2009/0250777 | A1 * | 10/2009 | Takamiya | 257/432 |
| 2010/0006984 | A1 * | 1/2010 | Watanabe et al. | 257/639 |

FOREIGN PATENT DOCUMENTS

| | | |
|---|---|---|
| JP | 06-077315 | 3/1994 |
| JP | 2003-273343 | 9/2003 |
| JP | 2005-150463 | 6/2005 |
| JP | 2005-167198 | 6/2005 |
| JP | 2006-049361 | 2/2006 |
| JP | 2007-013089 | 1/2007 |
| JP | 2008-182142 | 8/2008 |

* cited by examiner

*Primary Examiner* — Georgia Y Epps
*Assistant Examiner* — Carolynn A Moore
(74) *Attorney, Agent, or Firm* — Michael Best & Friedrich LLP

(57) ABSTRACT

Disclosed herein is a solid-state imaging device including: a sensor element having a plurality of pixels each having a photoelectric conversion section; and a logic element attached to the sensor element in such a manner as to be stacked on the sensor element face-to-face and provided with a pad electrode. In a stacked body of the sensor and logic elements, a pad opening is provided above the top surface of the pad electrode facing the sensor element, and a pad periphery guard ring is provided to surround the side portion of the pad opening. The pad periphery guard ring is formed by integrally filling, on the side of the pad opening, an entire trench that is at least as deep as the pad opening with a metal material.

16 Claims, 17 Drawing Sheets

1

1
X4
X3
PK
PAD
PG
PZ
CH
CG
x
y
z
P
LA
CA
SA
PA
X2
X1 x
z
y
100
200
X4
X3
CG
103
102
101
110
120
220
210
CG1
CG2
CG3
201
CH
TRC
104
PZ
PG1
TRP
PK1
PK2
PG2
210H
210Z
PAD
LA
SA
PK
PG x
z
y
100
200
102
101
110
120
220
210
201
X4
X3
CG2
CG3
CG3
CG2
PG2
210H
210Z
PAD
PG2
PZ
PZ
LA
SA x
y
z
100
200
102
101
110
120
220
210
201
TRC
TRC
TRP
TRP
PZ
PZ
X4
X3
CG2
CG3
CG3
CG2
PG2
210H
210Z
PAD
PG2
LA
SA x
y
z
100
200
102
101
110
120
220
210
201
X4
X3
CG1
TRC
CG2
CG3
PZ
PG1
TRP
PG2
210H
210Z
PAD
LA
SA x
z
y
100
200
104
103
102
101
110
120
220
210
201
CG1
CH TRC
X4
TRC CH
CG1
PG1
PZ
TRP
TRP
PZ
X3
CG2
CG3
LA
CG3
CG2
PG2
210H
210Z
SA
PAD
PK1
PK2
PK
PG1
PG2
PG x
z
y
100
200
104
103
102
101
110
120
220
210
201
CG1
TRC
CH
X4
TP
MO
CH
TRC
CG1
PZ
PG1
TRP
TRP
MO
PZ
X3
PK1
PK2
PK
PG1
PG2
PG
CG2
CG3
CG3
CG2
PG2
210H
210Z
PAD
LA
SA

1b
LA
CA
SA
PA
P
X1
X2
X3
X4
PK
PAD
PG
PZ
CG
x
y
z x
y
z
100
200
X4
X3
103
102
101
110
120
220
210
CG1
CG2
CG3
CG
201
TRC
104
PZ
PG1
TRP
PG2
210H
210Z
PAD
LA
SA
PK1
PK2
PK
PG

SOLID-STATE IMAGING DEVICE HAVING A METALLIC PAD PERIPHERY GUARD RING

BACKGROUND

The present technology relates to a solid-state imaging device, electronic equipment, a semiconductor device and a manufacturing method of the solid-state imaging device.

Electronic equipment such as a digital video camcorder and a digital still camera include a solid-state imaging device. Among solid-state imaging devices are a CMOS (Complementary Metal Oxide Semiconductor) image sensor and a CCD (Charge Coupled Device) image sensor.

A solid-state imaging device has a plurality of pixels arranged on the surface of a semiconductor substrate. A photoelectric conversion section is provided in each of the pixels. The photoelectric conversion section is, for example, a photodiode and receives incident light entering via external optics with its light-receiving surface to photoelectrically convert the received light, thus generating a signal charge.

Among solid-state imaging devices, the pixels of CMOS image sensors each include a pixel transistor in addition to a photoelectric conversion section. The pixel transistor reads the signal charge generated by the photoelectric conversion section and outputs the charge to the signal line as an electric signal.

In a solid-state imaging device, the photoelectric conversion section generally receives light entering from the front surface side of the semiconductor substrate on which circuits and interconnects are provided. In such a case, the circuits and interconnects block or reflect incident light, occasionally making it difficult to improve sensitivity. Therefore, a "back-illuminated type" has been proposed in which the photoelectric conversion section receives light entering from the back surface side of the semiconductor substrate, i.e., the side opposite to that on which the circuits and interconnects are provided (refer, for example, to Japanese Patent Laid-Open Nos. 2003-273343, 2005-150463 and 2008-182142).

As for a semiconductor device such as the above solid-state imaging device, "three-dimensional integration" has been proposed that is designed to stack elements having different functions and electrically connect these elements together. In "three-dimensional integration," a circuit best suited to each of the functions is formed on each semiconductor substrate, thus allowing for easy functional sophistication of the device. For example, a solid-state imaging device includes a sensor element and a logic element adapted to process a signal output from the sensor element stacked. These elements are stacked one on top of the other. Here, pad openings are provided to penetrate the semiconductor substrate so that the surface of a pad electrode is exposed. The elements are electrically connected via the pad openings (refer, for example, to Japanese Patent Laid-Open Nos. 2006-49361 and 2007-13089).

The semiconductor device as described above is manufactured by forming a plurality of semiconductor devices side by side on a semiconductor substrate. That is, a plurality of chips are arranged on a semiconductor wafer. Then, the wafer is diced along the scribing lines around each of the semiconductor devices, thus dividing the wafer into a plurality of semiconductor devices. In the dicing process, some divided devices may suffer chipping such as cracking or peeling, possibly resulting in lower yield. In particular, if a low-k film made of a low-dielectric insulating material lower in specific dielectric constant than $SiO_2$ is used as an insulating film, such a defect may manifest itself. In general, a low-k film has low adherence and mechanical strength, making the film prone to such a defect.

Various approaches have been proposed to prevent chipping.

For example, a trench is provided around the semiconductor device (chip) to stop the progress of chipping before the chipping reaches the area where the element is formed (refer, for example, to Japanese Patent Laid-Open No. Hei 06-77315).

In addition to the above, a guard ring is formed inside a multilayer interconnect layer so that chipping that occurs in the multilayer interconnect layer stops before the chipping reaches the area where the element is formed. In the process of forming a multilayer interconnect layer by providing an insulating layer and a metal interconnect alternately, for example, the guard ring is formed by making a film using a metal material adapted to form the interconnect. That is, the guard ring is formed by stacking a plurality of metal films one on top of the other (refer, for example, to Japanese Patent Laid-Open No. 2005-167198).

SUMMARY

However, some semiconductor devices such as the solid-state imaging device described above do not offer, for example, sufficiently high reliability or product yield.

In light of the foregoing, it is desirable to provide a solid-state imaging device, electronic equipment, semiconductor device and manufacturing method of the solid-state imaging device that contribute to improved reliability and product yield.

A solid-state imaging device and electronic equipment according to an embodiment of the present technology include sensor and logic elements. The sensor element has a plurality of pixels each having a photoelectric conversion section. The logic element has a pad electrode and is attached to the sensor element in such a manner as to be stacked on the sensor element face-to-face. In a stacked body of the sensor and logic elements, a pad opening is provided above the top surface of the pad electrode facing the sensor element. Further, a pad periphery guard ring is provided to surround the side portion of the pad opening. The pad periphery guard ring is formed by integrally filling, on the side of the pad opening, the entire trench that is at least as deep as the pad opening with a metal material.

A semiconductor device according to another embodiment of the present technology includes first and second semiconductor chips. The second semiconductor chip has a pad electrode and is attached to the first semiconductor chip in such a manner as to be stacked on the first semiconductor chip face-to-face. In a stacked body of the first and second semiconductor chips, a pad opening is provided above the top surface of the pad electrode facing the first semiconductor chip. Further, a pad periphery guard ring is provided to surround the side portion of the pad opening. The pad periphery guard ring is formed by integrally filling, on the side of the pad opening, the entire trench that is at least as deep as the pad opening with a metal material.

A manufacturing method of a solid-state imaging device according to still another embodiment of the present technology includes a step of attaching sensor and logic elements together in such a manner that the two elements are stacked one on top of the other face-to-face. The sensor element has a plurality of pixels each of which includes a photoelectric conversion section. The logic element has a pad electrode. The manufacturing method further includes a step of providing, in a stacked body of the sensor and logic elements, a pad periphery guard ring to surround the side portion of a pad opening provided above the top surface of the pad electrode facing the sensor element. In the step of providing the pad periphery guard ring, the pad periphery guard ring is formed by integrally filling, on the side of the pad opening, the entire trench that is at least as deep as the pad opening with a metal material.

According to a further embodiment of the present technology, a pad periphery guard ring is provided to surround the side portion of a pad opening provided above the top surface of the pad electrode. Here, the pad periphery guard ring is formed by integrally filling, on the side of the pad opening, the entire trench that is at least as deep as the pad opening with a metal material. The pad periphery guard ring blocks moisture absorbed from the pad opening from entering into the device.

According to further embodiments of the present technology, a solid-state imaging device, electronic equipment, a semiconductor device and a manufacturing method of the solid-state imaging device that contribute to improved reliability and product yield can be provided.

DETAILED DESCRIPTION OF THE PREFERRED EMBODIMENTS

A description will be given below of the preferred embodiments of the present technology with reference to the accompanying drawings.

It should be noted that the description will be given in the following order.

1. Embodiment 1 (with a hole ring)
2. Embodiment 2 (without any hole ring)
3. Others

1. Embodiment 1

A. Device Configuration (A-1) Configuration of Major Components of Camera

Figure 1:
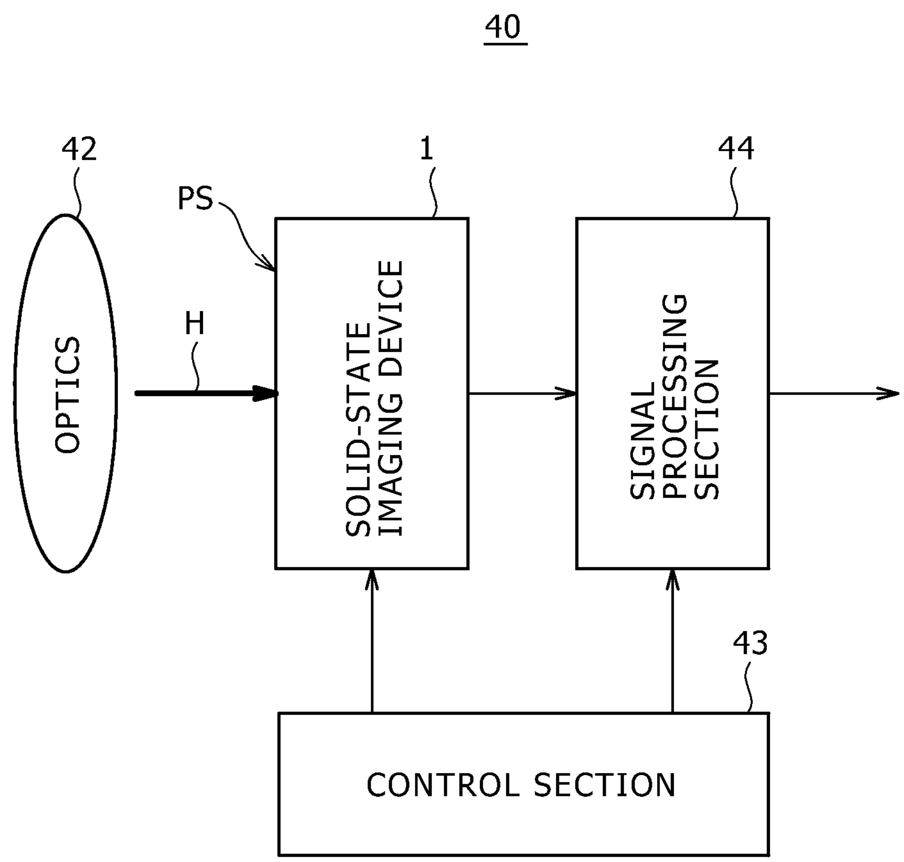
FIG. 1 is a diagram illustrating a configuration of a camera according to an embodiment 1.

FIG. 1 is a diagram illustrating a configuration of a camera according to an embodiment 1.

As illustrated in FIG. 1, a camera 40 includes a solid-state imaging device 1, optics 42, a control section 43 and a signal processing section 44. These components will be described one by one.

The solid-state imaging device 1 receives incident light H entering via the optics 42 as a subject image with an imaging surface PS and converts the received light photoelectrically, thus generating a signal charge. Here, the solid-state imaging device 1 is driven based on a control signal output from the control section 43. Then, the signal charge is read and output as an electric signal.

The optics 42 includes optical members such as an imaging lens and an aperture, and is arranged in such a manner as to focus the incident light H on the imaging surface PS of the solid-state imaging device 1.

The control section 43 outputs a variety of control signals to the solid-state imaging device 1 and the signal processing section 44, thus controlling and driving the solid-state imaging device 1 and the signal processing section 44.

The signal processing section 44 carries out signal processing of the electric signal output from the solid-state imaging device 1, thus generating a color digital image.

(A-2) Overall Configuration of Solid-State Imaging Device

A description will be given below of the overall configuration of the solid-state imaging device 1.

Figure 2:
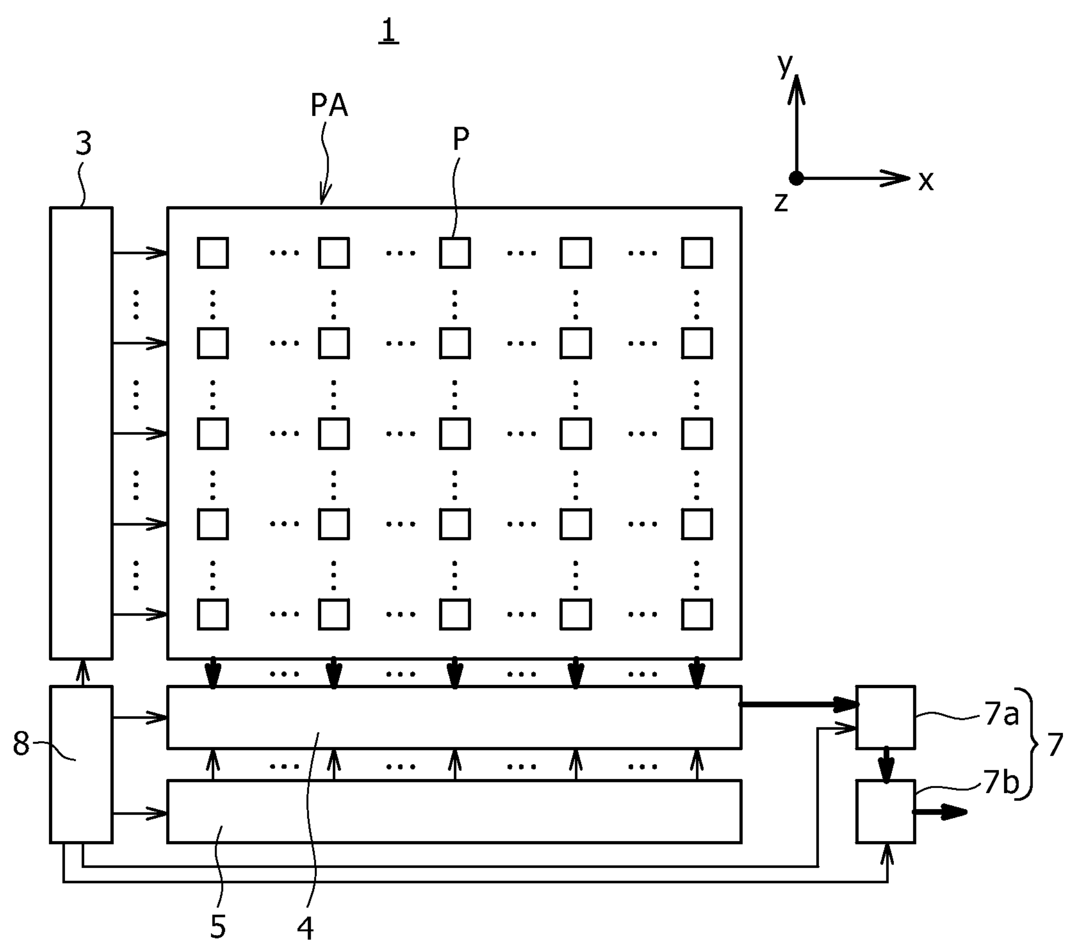
FIG. 2 is a diagram illustrating an overall configuration of a solid-state imaging device according to the embodiment 1.
Figure 3:
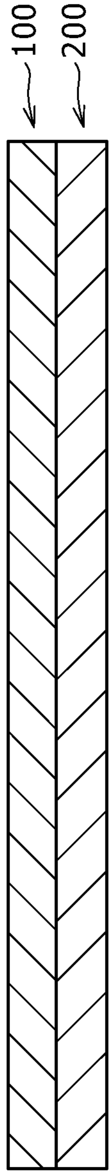
FIG. 3 is a diagram illustrating an overall configuration of the solid-state imaging device according to the embodiment 1.
Figure 3:
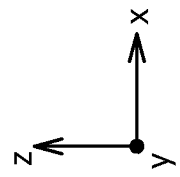

FIGS. 2 and 3 are diagrams each illustrating an overall configuration of the solid-state imaging device according to the embodiment 1.

FIG. 2 illustrates a block diagram, and FIG. 3 a cross-sectional view.

As illustrated in FIG. 2, a pixel area PA is provided in the solid-state imaging device 1.

The pixel area PA is rectangular and has a plurality of pixels P arranged in horizontal direction x and vertical direction y as illustrated in FIG. 2. That is, the pixels P are arranged in a matrix form. The pixel area PA corresponds to the imaging surface PS shown in FIG. 1. A detailed description of the pixels P will be given later.

In addition to the above, the solid-state imaging device 1 includes a vertical drive circuit 3, a column circuit 4, a horizontal drive circuit 5, an external output circuit 7 and a timing generator 8 as peripheral circuits as illustrated in FIG. 2.

The vertical drive circuit 3 is electrically connected on a row-by-row basis to the plurality of pixels P arranged side by side in the horizontal direction x in the pixel area PA as illustrated in FIG. 2.

The column circuit 4 carries out signal processing of the signals output from the pixels P on a column-by-column basis as illustrated in FIG. 2. Here, the column circuit 4 includes a CDS (Correlated Double sampling) circuit (not shown) and performs signal processing to remove fixed pattern noise.

The horizontal drive circuit 5 is electrically connected to the column circuit 4 as illustrated in FIG. 2. The horizontal drive circuit 5 includes, for example, a shift register and sequentially outputs the signals, held by the column circuit 4 for each of the columns of the pixels P, to the external output circuit 7.

The external output circuit 7 is electrically connected to the column circuit 4 as illustrated in FIG. 2. The external output circuit 7 carries out signal processing of the signals output from the column circuit 4 and then outputs the resultant signal externally. The external output circuit 7 includes an AGC (Automatic Gain Control) circuit 7*a* and ADC (Analog to Digital Converter) circuit 7*b*. In the external output circuit 7, the AGC circuit 7*a* applies a gain to the signal before the ADC circuit 7*b* converts the analog signal into a digital signal, and then the digital signal is output externally.

The timing generator 8 is electrically connected to the vertical drive circuit 3, the column circuit 4, the horizontal drive circuit 5 and the external output circuit 7 as illustrated in FIG. 2. The timing generator 8 generates a variety of pulse signals and outputs these signals to the vertical drive circuit 3, the column circuit 4, the horizontal drive circuit 5 and the external output circuit 7, thus controlling these circuits.

The solid-state imaging device 1 includes a sensor element 100 and a logic element 200 as illustrated in FIG. 3.

The sensor element 100 and the logic element 200 are face-to-face with each other as illustrated in FIG. 3, and the sides of the two elements facing each other are joined together. As described above, the solid-state imaging device 1 has a "three-dimensional laminated structure" in which the sensor element 100 and the logic element 200 are stacked one on top of the other. The sensor element 100 and the logic element 200 are electrically connected to each other.

In the solid-state imaging device 1, the pixel area PA shown in FIG. 2 is provided on the sensor element 100. Further, some of the peripheral circuits shown in FIG. 2 are provided on the sensor element 100. For example, the vertical drive circuit 3 and the timing generator 8 shown in FIG. 2 are provided around the pixel area PA.

In the solid-state imaging device 1, those of the peripheral circuits shown in FIG. 2 that are not provided on the sensor element 100 are provided on the logic element 200. For example, the column circuit 4, the horizontal drive circuit 5 and the external output circuit 7 shown in FIG. 2 are provided.

It should be noted that no peripheral circuits may be provided on the sensor element 100 and that all the peripheral circuits shown in FIG. 2 may be provided on the logic element 200. In addition to the above, an interconnect substrate may be provided instead of the logic element 200. That is, the solid-state imaging device 1 may be formed by stacking a plurality of semiconductor chips, each having a different function from other chips, one on top of the other.

(A-3) Configuration of Major Components of Solid-State Imaging Device 1

A description will be given below of configurations of major components of the solid-state imaging device 1.

FIGS. 4 to 7 are diagrams illustrating configurations of the major components of the solid-state imaging device according to the embodiment 1.

Figure 4:
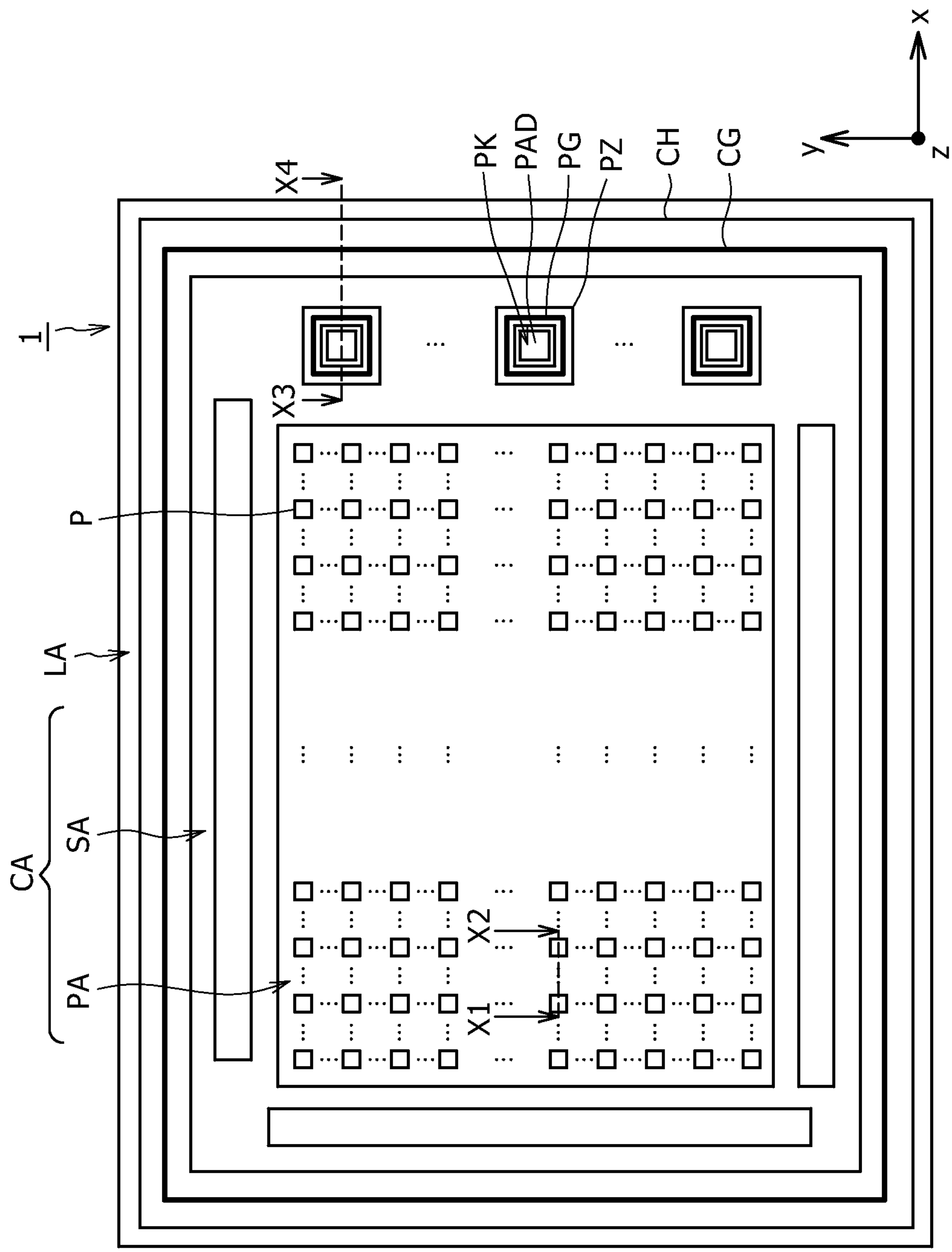
FIG. 4 is a diagram illustrating a configuration of major components of the solid-state imaging device according to the embodiment 1.

Here, FIG. 4 is a top view showing the side of the sensor element 100 of the solid-state imaging device 1.

Figure 5:
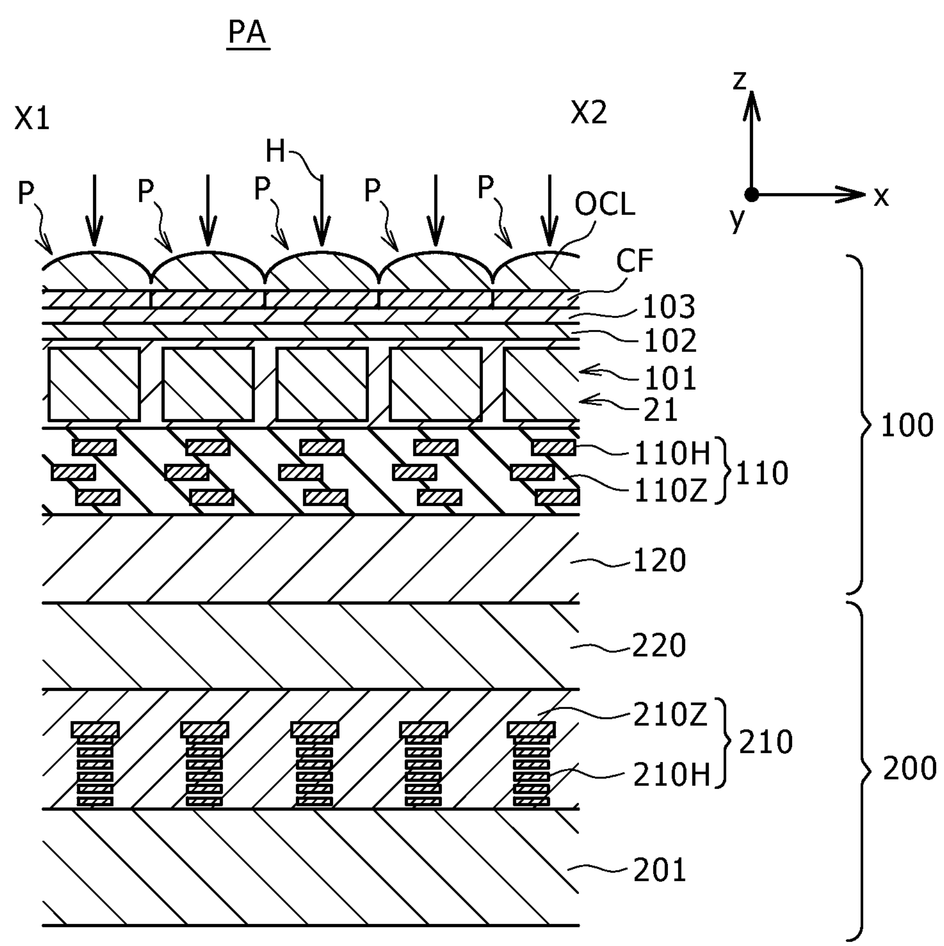
FIG. 5 is a diagram illustrating a configuration of the major components of the solid-state imaging device according to the embodiment 1.
Figure 6:
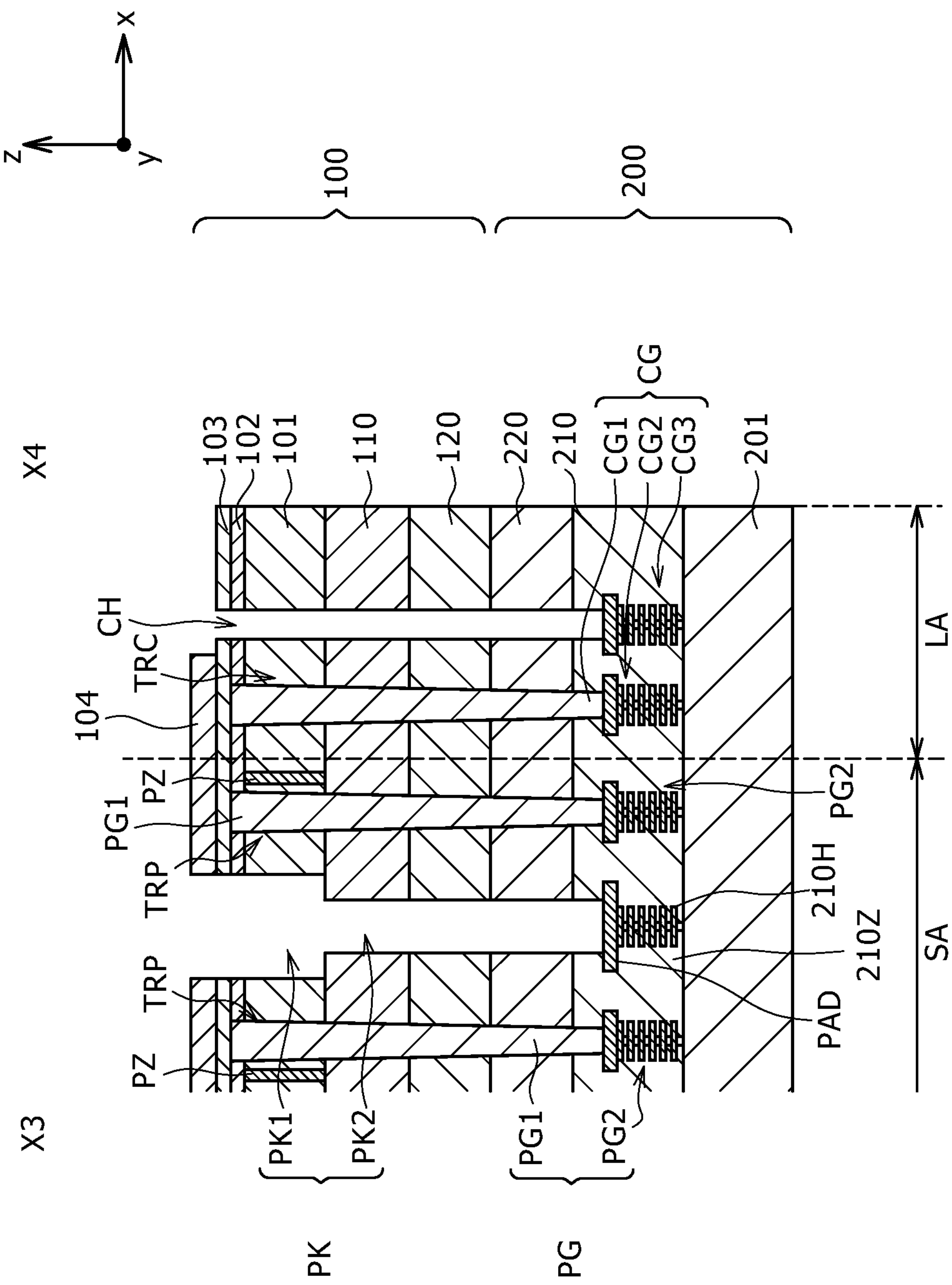
FIG. 6 is a diagram illustrating a configuration of the major components of the solid-state imaging device according to the embodiment 1.

FIGS. 5 and 6 are cross-sectional views. FIG. 5 illustrates a cross-sectional view along the line X1-X2 shown in FIG. 4. FIG. 6 illustrates a cross-sectional view along the line X3-X4 shown in FIG. 4.

Figure 7:
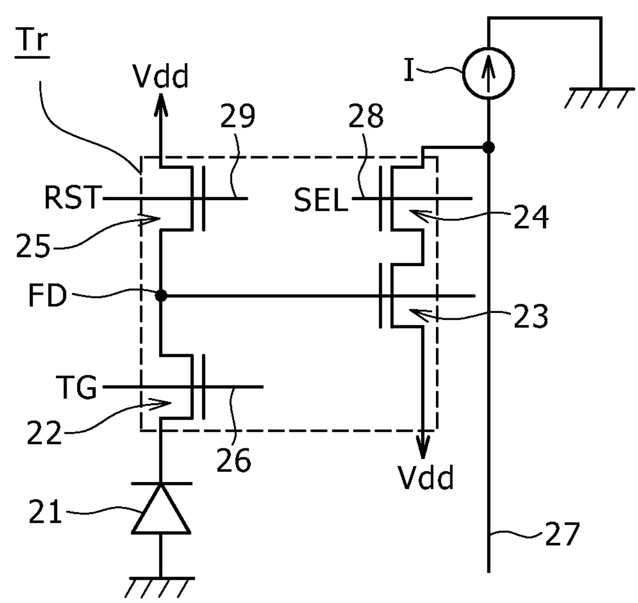
FIG. 7 is a diagram illustrating a configuration of the major components of the solid-state imaging device according to the embodiment 1.

FIG. 7 illustrates a circuit configuration of the pixel P.

(A-3-1) Outline of Top Surface Configuration

As illustrated in FIG. 4, a chip area CA and a scribing area LA are provided on the surface (xy plane) of the solid-state imaging device 1.

As illustrated in FIG. 4, the chip area CA is rectangular and partitioned in the horizontal direction x and the vertical direction y, and includes the above-described pixel area PA (refer to FIG. 2). In addition, the chip area CA also includes a surrounding area SA.

In the chip area CA, the pixel area PA is rectangular and has the plurality of pixels P arranged side by side in the horizontal direction x and the vertical direction y as illustrated in FIG. 4.

In the chip area CA, the surrounding area SA is located around the pixel area PA as illustrated in FIG. 4.

In the surrounding area SA, a pad electrode PAD, a pad periphery guard ring PG and a pad periphery insulating ring PZ are provided as illustrated in FIG. 4.

The scribing area LA surrounds the chip area CA as illustrated in FIG. 4. Here, the scribing area LA includes portions extending in the horizontal direction x and in the vertical direction y, forming a rectangle around the chip area CA.

A chip periphery guard ring CG and a chip periphery hole ring CH are provided in the scribing area LA as illustrated in FIG. 4.

Although described in detail later, the wafer has the plurality of chip areas CA arranged side by side prior to dicing (not shown). The scribing area LA extends linearly between the plurality of chip areas CA. A blade is brought in contact with the scribing area LA for dicing, thus dividing the wafer into the solid-state imaging devices 1 each having the above-described chip area CA.

(A-3-2) Outline of Cross-Sectional Structure

As illustrated in FIGS. 5 and 6, the above-described solid-state imaging device 1 includes the sensor element 100 and the logic element 200, and the two elements are facing each other and attached together.

The sensor element 100 includes a semiconductor substrate 101 as illustrated in FIGS. 5 and 6. The semiconductor substrate 101 is made, for example, of monocrystalline silicon.

As illustrated in FIGS. 5 and 6, an interconnect layer 110 and an insulating layer 120 are provided sequentially on the front surface (bottom surface) of the semiconductor substrate 101 of the sensor element 100, that is, on the surface of the side facing the logic element 200. Each of the interconnect layer 110 and the insulating layer 120 is provided to span the whole of the pixel area PA, the surrounding area SA and the scribing area LA on the front surface (bottom surface) of the semiconductor substrate 101.

In the sensor element 100, photodiodes 21 are provided in the pixel area PA inside the semiconductor substrate 101 as illustrated in FIG. 5.

In the sensor element 100, a first insulating film 102 and a second insulating film 103 are sequentially provided on the back surface (top surface) of the semiconductor substrate 101 as illustrated in FIGS. 5 and 6. The first insulating film 102 and the second insulating film 103 are each provided to span the whole of the pixel area PA, the surrounding area SA and the scribing area LA on the back surface (top surface) of the semiconductor substrate 101. Further, a color filter CF and on-chip lenses OCL are sequentially provided in the pixel area PA on the back surface (top surface) of the semiconductor substrate 101 with the first and second insulating films 102 and 103 sandwiched therebetween as illustrated in FIG. 5. In addition to the above, a lens material layer 104 is provided in the surrounding area SA and the scribing area LA on the back surface (top surface) of the semiconductor substrate 101 with the first and second insulating films 102 and 103 sandwiched therebetween as illustrated in FIG. 6.

Although not shown, semiconductor circuit elements (not shown) are provided on the bottom surface side of the sensor element 100 on which the interconnect layer 110 is provided. More specifically, the semiconductor circuit elements (not shown) are provided in the pixel area PA in such a manner as to form a pixel transistor Tr shown in FIG. 7. Further, semiconductor circuit elements (not shown) are provided in the surrounding area SA in such a manner as to form, for example, the vertical drive circuit 3 and the timing generator 8 shown in FIG. 2.

The logic element 200 includes a semiconductor substrate 201 as illustrated in FIGS. 5 and 6. The same substrate 201 is made, for example, of monocrystalline silicon. The semiconductor substrate 201 of the logic element 200 faces the semiconductor substrate 101 of the sensor element 100. The semiconductor substrate 201 of the logic element 200 serves as a support substrate, thus securing the overall strength of the solid-state imaging device 1.

An interconnect layer 210 and an insulating layer 220 are sequentially provided on the front surface (top surface) of the semiconductor substrate 201 of the logic element 200, that is, on the surface of the side facing the sensor element 100 as illustrated in FIGS. 5 and 6. Each of the interconnect layer 210 and the insulating layer 220 is provided to span the whole of the pixel area PA, the surrounding area SA and the scribing area LA on the front surface (top surface) of the semiconductor substrate 201.

Although not shown, semiconductor circuit elements (not shown) such as MOS transistors are provided on the front surface (top surface) side of the semiconductor substrate 201 of the logic element 200. The semiconductor circuit elements (not shown) are provided in such a manner as to form, for example, the column circuit 4, the horizontal drive circuit 5 and the external output circuit 7 shown in FIG. 2.

The insulating layer 120 of the sensor element 100 and the insulating layer 220 of the logic element 200 are joined together in the solid-state imaging device 1 as illustrated in FIGS. 5 and 6, thus attaching the sensor element 100 and logic element 200 to each other.

The solid-state imaging device 1 is configured so that the photodiodes 21 receive the incident light H entering from the back surface (top surface) of the semiconductor substrate 101 of the sensor element 100, i.e., from the side opposite to the front surface (bottom surface) on which the interconnect layer 110 is provided as illustrated in FIG. 5.

That is, the solid-state imaging device 1 is a “back-illuminated CMOS image sensor.”

Further, the pad electrode PAD, the pad periphery guard ring PG and the pad periphery insulating ring PZ shown in FIG. 4 are provided in the surrounding area SA of the solid-state imaging device 1 as illustrated in FIG. 6.

Still further, the chip periphery guard ring CG and the chip periphery hole ring CH shown in FIG. 4 are provided in the scribing area LA as illustrated in FIG. 6.

(A-3-3) Detailed Configuration of Each Section

A detailed description will be given one by one of the sections making up the solid-state imaging device 1.

(a) Photodiodes 21

The photodiodes 21 are provided, one for each of the plurality of pixels P, in the pixel area PA as illustrated in FIG. 5. The photodiodes 21 are provided in the semiconductor substrate 101 of the sensor element 100 that has been, for example, thinned down to 1 to 30 μm.

The photodiodes 21 are formed to receive the incident light H entering as a subject image and photoelectrically convert the light, thus generating and accumulating signal charge.

Here, the color filter CF and the on-chip lenses OCL are provided on the back surface (top surface) side of the semiconductor substrate 101 and above the photodiodes 21 as illustrated in FIG. 5. Therefore, the photodiodes 21 receive the incident light H entering via these sections with their light-receiving surfaces JS for photoelectric conversion.

Each of the photodiodes 21 includes, for example, an n-type charge accumulation area (not shown) that is provided in a p-type semiconductor area (not shown) of the semiconductor substrate 101. In the n-type charge accumulation area, a p-type semiconductor area having a high impurity concentration (not shown) is provided as a hole accumulation layer on the front surface side of the semiconductor substrate 101. That is, each of the photodiodes 21 has a HAD (Hole Accumulation Diode) structure.

As illustrated in FIG. 7, each of the photodiodes 21 has its anode grounded. The accumulated signal charge (electrons in this case) is read by the pixel transistor Tr and output to a vertical signal line 27 as an electric signal.

(b) Pixel Transistor Tr

The pixel transistor Tr is provided for each of the plurality of pixels P in the pixel area PA as described above. The pixel transistor Tr includes a transfer transistor 22, an amplifying transistor 23, a selection transistor 24 and a reset transistor 25 as illustrated in FIG. 7 and outputs a signal charge from the photodiode 21 as an electric signal in each of the pixels P.

Although not shown in FIG. 5 as described above, the pixel transistor Tr is provided on the front surface (bottom surface) of the semiconductor substrate 101. More specifically, for example, an activation area (not shown) is formed for the transistors 22 to 25 making up the pixel transistor Tr in the area adapted to isolate the one pixel P from another in the semiconductor substrate 101. Each gate of the transistors is formed using polysilicon containing n-type impurity.

In the pixel transistor Tr, the transfer transistor 22 transfers the signal charge generated by the photodiode 21 to a floating diffusion FD as illustrated in FIG. 7. More specifically, the transfer transistor 22 is provided between the cathode of the photodiode 21 and the floating diffusion FD. The transfer transistor 22 has its gate electrically connected to a transfer line 26. The transfer transistor 22 transfers the signal charge accumulated by the photodiode 21 to the floating diffusion FD based on a transfer signal TG transmitted to the gate from the transfer line 26.

In the pixel transistor Tr, the amplifying transistor 23 amplifies the electric signal converted from charge into voltage by the floating diffusion FD and outputs the amplified electric signal as illustrated in FIG. 7. More specifically, the amplifying transistor 23 has its gate electrically connected to the floating diffusion FD. Further, the amplifying transistor 23 has its drain electrically connected to a power supply line Vdd and its source electrically connected to the selection transistor 24. When the selection transistor 24 is selected to turn ON, a constant current is supplied from a constant current source I to the amplifying transistor 23, thus allowing the amplifying transistor 23 to serve as a source follower. Therefore, when a selection signal is supplied to the selection transistor 24, the amplifying transistor 23 amplifies the electric signal converted from charge into voltage by the floating diffusion FD.

In the pixel transistor Tr, the selection transistor 24 outputs the electric signal, output from the amplifying transistor 23, to the vertical signal line 27 based on a selection signal as illustrated in FIG. 7. More specifically, the selection transistor 24 has its gate connected to an address line 28 via which a selection signal is supplied. The selection transistor 24 turns ON when supplied with a selection signal, outputting the output signal amplified by the amplifying transistor 23 as described above to the vertical signal line 27.

In the pixel transistor Tr, the reset transistor 25 resets the gate potential of the amplifying transistor 23 as illustrated in FIG. 7. More specifically, the reset transistor 25 has its gate electrically connected to a reset line 29 via which a reset signal is supplied. Further, the reset transistor 25 has its drain electrically connected to the power supply line Vdd and its source electrically connected to the floating diffusion FD. The reset transistor 25 resets the gate potential of the amplifying transistor 23 to the power supply voltage via the floating diffusion FD based on a reset signal transmitted from the reset line 29.

The gates of the transistors 22, 24 and 25 are each connected together in each row of the plurality of pixels P arranged side by side in the horizontal direction x. As a result, the plurality of pixels P arranged on a row-by-row basis are driven at the same time. More specifically, the pixels P are sequentially selected in the vertical direction on a horizontal line-by-horizontal line (pixel row-by-pixel row) basis by a selection signal supplied by the above-described vertical drive circuit 3 (refer to FIG. 2). The transistors of each of the pixels P are controlled by a variety of timing signals output from the timing generator 8 (refer to FIG. 2). As a result, the output signals of the pixels P are read into the column circuit 4 (refer to FIG. 2) via the vertical signal line 27 on a column-by-column basis. The signal held by the column circuit 4 is selected by the horizontal drive circuit 5 (refer to FIG. 2) and sequentially output to the external output circuit 7 (refer to FIG. 2).

(c) Color Filter CF

The color filter CF is provided in the pixel area PA on the back surface (top surface) side of the semiconductor substrate 101 as illustrated in FIG. 5.

Here, the first insulating film 102 and the second insulating film 103 are provided on the back surface (top surface) of the semiconductor substrate 101.

The first insulating film 102 is made of an insulating material such as SiN to serve as an anti-reflection film.

The second insulating film 103 is made of a low-dielectric insulating material such as SiC to serve as an anti-copper diffusion film.

The color filter CF is formed on top of the second insulating film 103.

The color filter CF is formed in such a manner that the incident light H entering from the back surface (top surface) side of the semiconductor substrate 101 via the on-chip lenses OCL is colored and may penetrate. For example, the color filter CF is formed to selectively pass light in a given range of wavelengths of visible radiation entering as the incident light H.

The color filter CF includes, for example, red, green and blue filter layers (not shown). These filters of three primary colors are arranged in a Bayer pattern, one for each of the pixels P.

The color filter CF is formed, for example, by applying a solution containing a color pigment and a photoresist resin by spin coating or other coating method so as to form a film and then patterning the film by lithography technique.

(d) On-Chip Lenses OCL and Lens Material Layer 104

The on-chip lenses OCL are provided in the pixel area PA, one for each of the plurality of pixels P as illustrated in FIG. 5.

The on-chip lenses OCL are provided on top of the color filter CF on the back surface (top surface) side of the semiconductor substrate 101.

Each of the on-chip lenses OCL is a convex lens protruding upward in a convex form from the back surface (top surface) of the semiconductor substrate 101, and focuses the incident light H entering from the back surface (top surface) side of the semiconductor substrate 101 onto the photodiode 21.

Although described in detail later, the on-chip lenses OCL are formed by shaping the lens material layer 104 (refer to FIG. 6) formed on top of the second insulating film 103 with the color filter CF sandwiched therebetween.

The lens material layer 104 is provided, for example, by forming an organic resin film on top of the second insulating film 103. Then, a photoresist film (not shown) is provided on top of the lens material layer 104, followed by patterning of the photoresist film (not shown) into the form of lenses. Next, the lens material layer 104 is etched back using the resist pattern in the form of lenses (not shown) as a mask, thus forming the on-chip lenses OCL. It should be noted that, in addition, the on-chip lenses OCL may be formed by subjecting the patterned lens material layer 104 to a reflow process.

The lens material layer 104 is not shaped into the on-chip lenses OCL in the surrounding area SA and the scribing area LA as illustrated in FIG. 6. Instead, the lens material layer 104 is provided to cover the top surface of the second insulating film 103.

As illustrated in FIG. 6, the lens material layer 104 is provided in the surrounding area SA to cover the area, where the pad periphery guard ring PG is provided, on top of the semiconductor substrate 101 with the second insulating film 103 sandwiched therebetween. The lens material layer 104 also covers the area, where the pad periphery insulating ring PZ is provided, with the first insulating film 102 and the second insulating film 103 sandwiched therebetween. Further, the lens material layer 104 has a pad opening PK formed in the area where the pad electrode PAD is provided.

The lens material layer 104 in the scribing area LA is provided in the portion close to the surrounding area SA, and not provided in the portion far from the surrounding area SA as illustrated in FIG. 6.

More specifically, the lens material layer 104 in the scribing area LA is provided in the portion close to the surrounding area SA to cover the area, where a chip periphery guard ring CG is provided on top of the semiconductor substrate 101, with the second insulating film 103 sandwiched therebetween. However, the lens material layer 104 in the scribing area LA is not provided in the portion far from the surrounding area SA and close to the portion to be diced.

(e) Interconnect Layer 110 and Insulating Layer 120 of Sensor Element 100

In the sensor element 100 as illustrated in FIGS. 5 and 6, the interconnect layer 110 is provided on the front surface (bottom surface) of the semiconductor substrate 101, i.e., on the side opposite to the back surface (top surface) side on which the color filter CF, on-chip lenses OCL and other sections are provided. That is, in the sensor element 100, the interconnect layer 110 is provided on the surface (bottom surface) of the side of the semiconductor substrate 101 facing the logic element 200.

The interconnect layer 110 includes interconnects 110H and an insulating layer 110Z as illustrated in FIG. 5. The interconnects 110H are provided in the insulating layer 110Z. The interconnect layer 110 is a so-called multilayer interconnect layer and is formed by stacking an interlayer insulating film making up the insulating layer 110Z and the interconnect 110H alternately a plurality of times.

The insulating layer 110Z is made, for example, of an insulating material such as silicon oxide. The interconnects 110H are made of a conductive metal material such as aluminum.

In the interconnect layer 110, the plurality of interconnects 110H are stacked to serve as the interconnects of the transfer line 26, the address line 28, the vertical signal line 27, the reset line 29 and the like shown in FIG. 7.

As illustrated in FIGS. 5 and 6, the insulating layer 120 is provided on the front surface (bottom surface) of the interconnect layer 110, i.e., the side opposite to that on which the semiconductor substrate 101 is provided.

The insulating layer 120 is made, for example, of an insulating material such as silicon oxide.

(f) Interconnect Layer 210 and Insulating Layer 220 of Logic Element 200

In the logic element 200, the interconnect layer 210 is provided on the surface (top surface) of the semiconductor substrate 201 facing the sensor element 100 as illustrated in FIGS. 5 and 6.

The interconnect layer 210 includes interconnects 210H and insulating layer 210Z, and the interconnects 210H are provided in the insulating layer 210Z as illustrated in FIG. 5. The interconnect layer 210 is a so-called multilayer interconnect layer and is formed by stacking an interlayer insulating film making up the insulating layer 210Z and the interconnect 210H alternately a plurality of times.

The insulating layer 210Z is made, for example, of an insulating material such as silicon oxide. The interconnects 210H are made of a conductive metal material such as aluminum.

In the interconnect layer 210, the plurality of interconnects 210H are stacked to serve as interconnects electrically connected to semiconductor circuit elements (not shown) provided on the semiconductor substrate 201 of the logic element 200.

As illustrated in FIGS. 5 and 6, the insulating layer 220 is provided on the front surface (top surface) of the interconnect layer 210, i.e., on the side opposite to that on which the semiconductor substrate 201 is provided.

The insulating layer 220 is made, for example, of an insulating material such as silicon oxide.

(g) Pad Electrodes PAD

The pad electrodes PAD are provided in the surrounding area SA as illustrated in FIGS. 4 and 6.

Here, the plurality of pad electrodes PAD are provided on the right of the pixel area PA as illustrated in FIG. 4.

Further, the pad electrodes PAD are provided in the interconnect layer 210 of the logic element 200 as illustrated in FIG. 6.

More specifically, the pad electrodes PAD are provided in the insulating layer 210Z making up the interconnect layer 210. The pad electrodes PAD are made, for example, of a conductive metal material such as aluminum as are the other interconnects 210H making up the interconnect layer 210.

Each of the pad electrodes PAD is electrically connected to the other interconnects 210H, thus electrically connecting the semiconductor circuit elements (not shown) provided in the logic element 200 and elements (not shown) provided outside of the logic element 200. For example, the pad electrode PAD is electrically connected to other pad electrode (not shown) provided in the interconnect layer 110 of the sensor element 100. Further, the pad electrode PAD is electrically connected to an external element (not shown) provided outside of the sensor element 100 by using a bonding wire (not shown).

The pad electrode PAD has the pad opening PK formed thereabove, thus making the top surface of the pad electrode PAD exposed as illustrated in FIG. 6.

Here, the pad opening PK extends from the top surface of the pad electrode PAD to the top surface of the lens material layer 104.

More specifically, the pad opening PK includes a first pad opening PK1 and a second pad opening PK2. The first and second pad openings PK1 and PK2 are provided one on top of the other in a depth direction z.

The first pad opening PK1 extends from the top surface of the interconnect layer 110 of the sensor element 100 to the top surface of the lens material layer 104 as illustrated in FIG. 6. That is, the first pad opening PK1 is formed to penetrate each of the semiconductor substrate 101, the first insulating film 102, the second insulating film 103 and the lens material layer 104 of the sensor element 100.

The second pad opening PK2 extends from the top surface of the pad electrode PAD to the top surface of the interconnect layer 110 of the sensor element 100 as illustrated in FIG. 6. That is, the second pad opening PK2 is formed to penetrate the interconnect layer 110 and the insulating layer 120 of the sensor element 100. Further, the second pad opening PK2 is formed to penetrate the insulating layer 220 and an upper portion of the interconnect layer 210, above the top surface of the pad electrode PAD, of the logic element 200.

(h) Pad Periphery Guard Rings PG

The pad periphery guard rings PG are provided in the surrounding area SA as illustrated in FIGS. 4 and 6.

Here, the pad periphery guard rings PG are each provided to rectangularly surround the pad electrode PAD as illustrated in FIG. 4.

As illustrated in FIG. 6, the pad periphery guard ring PG is provided to extend from the front surface (top surface) of the semiconductor substrate 201 of the logic element 200 to the top surface of the first insulating film 102 of the sensor element 100.

The pad periphery guard ring PG includes a first pad periphery guard ring PG1 and a second pad periphery guard ring PG2 as illustrated in FIG. 6. The first and second pad periphery guard rings PG1 and PG2 are stacked one on top of the other in the depth direction z.

Of the rings making up the pad periphery guard ring PG, the first pad periphery guard ring PG1 is located on the side of the pad opening PK as illustrated in FIG. 6. Further, the first pad periphery guard ring PG1 is formed to narrow from top to bottom in the depth direction z.

As illustrated in FIG. 6, the first pad periphery guard ring PG1 is formed in a trench TRP that is formed to extend from the top surface of the first insulating film 102 of the sensor element 100 to the top surface of the second pad periphery guard ring PG2. More specifically, the first pad periphery guard ring PG1 is formed to penetrate each of the semiconductor substrate 101, the first insulating film 102, the interconnect layer 110 and the insulating layer 120 of the sensor element 100. The first pad periphery guard ring PG1 also penetrates the insulating layer 220 and an upper portion of the interconnect layer 210, above the second pad periphery guard ring PG2, of the logic element 200. As described above, the first pad periphery guard ring PG1 is provided in the trench TRP that penetrates the sensor element 100 as a TCV (Through Chip Via).

Of the rings making up the pad periphery guard ring PG, the second pad periphery guard ring PG2 is located on the side of the pad electrode PAD as illustrated in FIG. 6.

As illustrated in FIG. 6, the second pad periphery guard ring PG2 is provided in the interconnect layer 210.

Each of the first and second pad periphery guard rings PG1 and PG2 is formed to block moisture absorbed from the side surface inside the pad opening PK from entering into the chip area CA (the pixel area PA and the surrounding area SA). That is, each of the first and second pad periphery guard rings PG1 and PG2 is made of a material more resistant to moisture penetration than the portion located between itself and the pad opening PK.

For example, the first pad periphery guard ring PG1 is made of a metal material such as copper. The first pad periphery guard ring PG1 is formed by integrally filling the entire trench TRP with a metal material as illustrated in FIG. 6.

The second pad periphery guard ring PG2 is formed, for example, by stacking metal conductive films made of a conductive metal material such as aluminum as with the interconnects 210H making up the interconnect layer 210. Further, the second pad periphery guard ring PG2 has metal layers adapted to connect the plurality of stacked metal conductive films.

(i) Pad Periphery Insulating Rings PZ

The pad periphery insulating rings PZ are provided in the surrounding area SA as illustrated in FIGS. 4 and 6.

Here, the pad periphery insulating rings PZ are each provided to rectangularly surround the pad electrode PAD with the pad periphery guard ring PG sandwiched therebetween as illustrated in FIG. 4.

Here, as illustrated in FIG. 6, the pad periphery insulating ring PZ penetrates the semiconductor substrate 101, from the back surface (top surface) to the front surface (bottom surface) thereof, of the sensor element 100.

The pad periphery insulating ring PZ is made of an insulating material, and is used, for example, as an alignment mark during manufacture.

(j) Chip Periphery Hole Ring CH

The chip periphery hole ring CH is provided in the scribing area LA as illustrated in FIGS. 4 and 6.

Here, as illustrated in FIG. 4, the chip periphery hole ring CH is located more inward toward the chip area CA than the edge portion to be diced in the scribing area LA, and is provided to rectangularly surround the chip area CA.

As illustrated in FIG. 6, the chip periphery hole ring CH is an air gap and formed by making an opening from an upper portion of the interconnect layer 210 of the logic element 200 to the top surface of the second insulating film 103 of the sensor element 100. That is, the chip periphery hole ring CH is formed to penetrate each of the semiconductor substrate 101, the first insulating film 102, the second insulating film 103, the interconnect layer 110 and the insulating layer 120 of the sensor element 100. Further, the chip periphery hole ring CH is formed by providing a groove that penetrates the insulating layer 220 and an upper portion of the interconnect layer 210 of the logic element 200.

The chip periphery hole ring CH is formed to have the same width in the depth direction z as illustrated in FIG. 6. Although described in detail later, the chip periphery hole ring CH is provided to prevent chipping developed during dicing in the scribing area LA from reaching the chip area CA.

(k) Chip Periphery Guard Ring CG

The chip periphery guard ring CG is provided in the scribing area LA as illustrated in FIGS. 4 and 6.

Here, as illustrated in FIG. 4, the chip periphery guard ring CG is located more inward toward the chip area CA than the edge portion to be diced in the scribing area LA, and is provided to rectangularly surround the chip area CA.

The chip periphery guard ring CG includes a first chip periphery guard ring CG1 and a second chip periphery guard ring CG2 as illustrated in FIG. 6. The first and second chip periphery guard rings CG1 and CG2 are stacked one on top of the other in the depth direction z, and are located closer to the chip area CA than the chip periphery hole ring CH.

Of the rings making up the chip periphery guard ring CG, the first chip periphery guard ring CG1 is located on the side of the chip periphery hole ring CH as illustrated in FIG. 6. The chip periphery guard ring CG1 is formed to narrow from top to bottom in the depth direction z.

As illustrated in FIG. 6, the first chip periphery guard ring CG1 is formed in a trench TRC that is formed to extend from the top surface of the first insulating film 102 of the sensor element 100 to the top surface of the second chip periphery guard ring CG2. More specifically, the first chip periphery guard ring CG1 is formed to penetrate each of the semiconductor substrate 101, the first insulating film 102, the interconnect layer 110 and the insulating layer 120 of the sensor element 100. Further, the first chip periphery guard ring CG1 is formed to penetrate the insulating layer 220 and an upper portion of the interconnect layer 210, above the second chip periphery guard ring CG2, of the logic element 200. As described above, the first chip periphery guard ring CG1 is provided in the trench TRC that penetrates the sensor element 100 as a TCV as with the first pad periphery guard ring PG1.

The first chip periphery guard ring CG1 is formed to block moisture absorbed from the side surface inside the chip periphery hole ring CH from entering into the chip area CA (the pixel area PA and the surrounding area SA). Here, the first chip periphery guard ring CG1 is made of a material more resistant to moisture penetration than the portion located between itself and the chip periphery hole ring CH. Moreover, the first chip periphery guard ring CG1 is provided to prevent chipping developed during dicing in the scribing area LA from reaching the chip area CA from the side surface. Here, the first chip periphery guard ring CG1 is made of a material different in properties such as hardness and modulus of rigidity from the portions located between itself and the chip periphery hole ring CH, e.g., made, for example, of a material having a high mechanical strength.

For example, the first chip periphery guard ring CG1 is made of a metal material such as copper as is the first pad periphery guard ring PG1. The first chip periphery guard ring CG1 is formed by integrally filling the entire trench TRC with a metal material as illustrated in FIG. 6.

Of the rings making up the chip periphery guard ring CG, the second chip periphery guard ring CG2 is provided in the interconnect layer 210 of the logic element 200 as is the second pad periphery guard ring PG2 as illustrated in FIG. 6. The second chip periphery guard ring CG2 is formed by connecting and stacking a plurality of metal conductive films in the insulating layer 210Z making up the interconnect layer 210.

The chip periphery guard ring CG further includes a third chip periphery guard ring CG3 as illustrated in FIG. 6.

Of the rings making up the chip periphery guard ring CG, the third chip periphery guard ring CG3 is provided at a position similar to that of the chip periphery hole ring CH although not shown in FIG. 4. That is, the third chip periphery guard ring CG3 is located more inward toward the chip area CA than the edge portion to be diced in the scribing area LA, as is the chip periphery hole ring CH. The third chip periphery guard ring CG3 is provided to rectangularly surround the chip area CA, as is the chip periphery hole ring CH. The third chip periphery guard ring CG3 is located farther from the chip area CA than the second chip periphery guard ring CG2.

The third chip periphery guard ring CG3 is provided in the interconnect layer 210 of the logic element 200 as is the second chip periphery guard ring CG2 as illustrated in FIG. 6. The third chip periphery guard ring CG3 is formed by connecting and stacking a plurality of metal conductive films in the insulating layer 210Z making up the interconnect layer 210.

That is, a plurality of guard rings, namely, the second and third chip periphery guard rings CG2 and CG3, are provided in the interconnect layer 210 of the logic element 200 in the scribing area LA.

Each of the second and third chip periphery guard rings CG2 and CG3 is formed to block moisture absorbed from the diced side surface from entering into the chip area CA (the pixel area PA and the surrounding area SA). Moreover, each of the second and third chip periphery guard rings CG2 and CG3 is provided to prevent chipping developed during dicing in the scribing area LA from reaching the chip area CA from the side surface.

Each of the second and third chip periphery guard rings CG2 and CG3 is made, for example, of a conductive metal material such as aluminum as are the interconnects 210H making up the interconnect layer 210.

[B] Manufacturing Method

A description will be given below of the main features of a manufacturing method for manufacturing the above-described solid-state imaging device 1.

Figure 8:
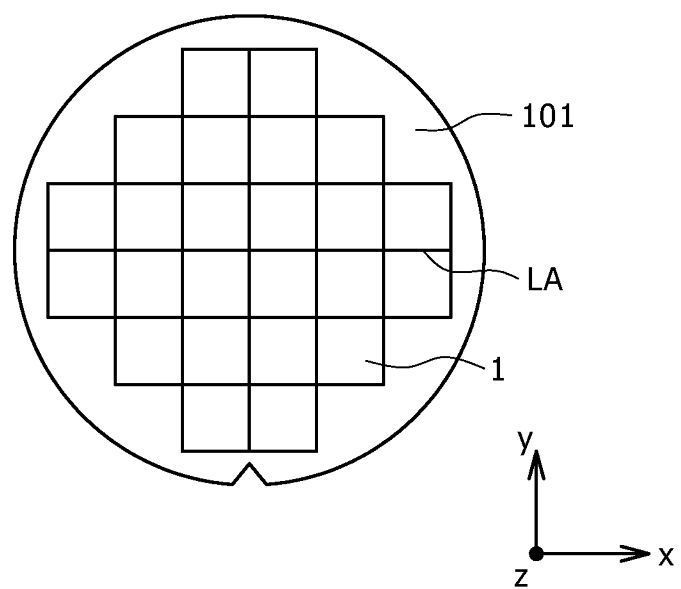
FIG. 8 is a diagram illustrating a manufacturing method of the solid-state imaging device according to the embodiment 1.
Figure 9A:
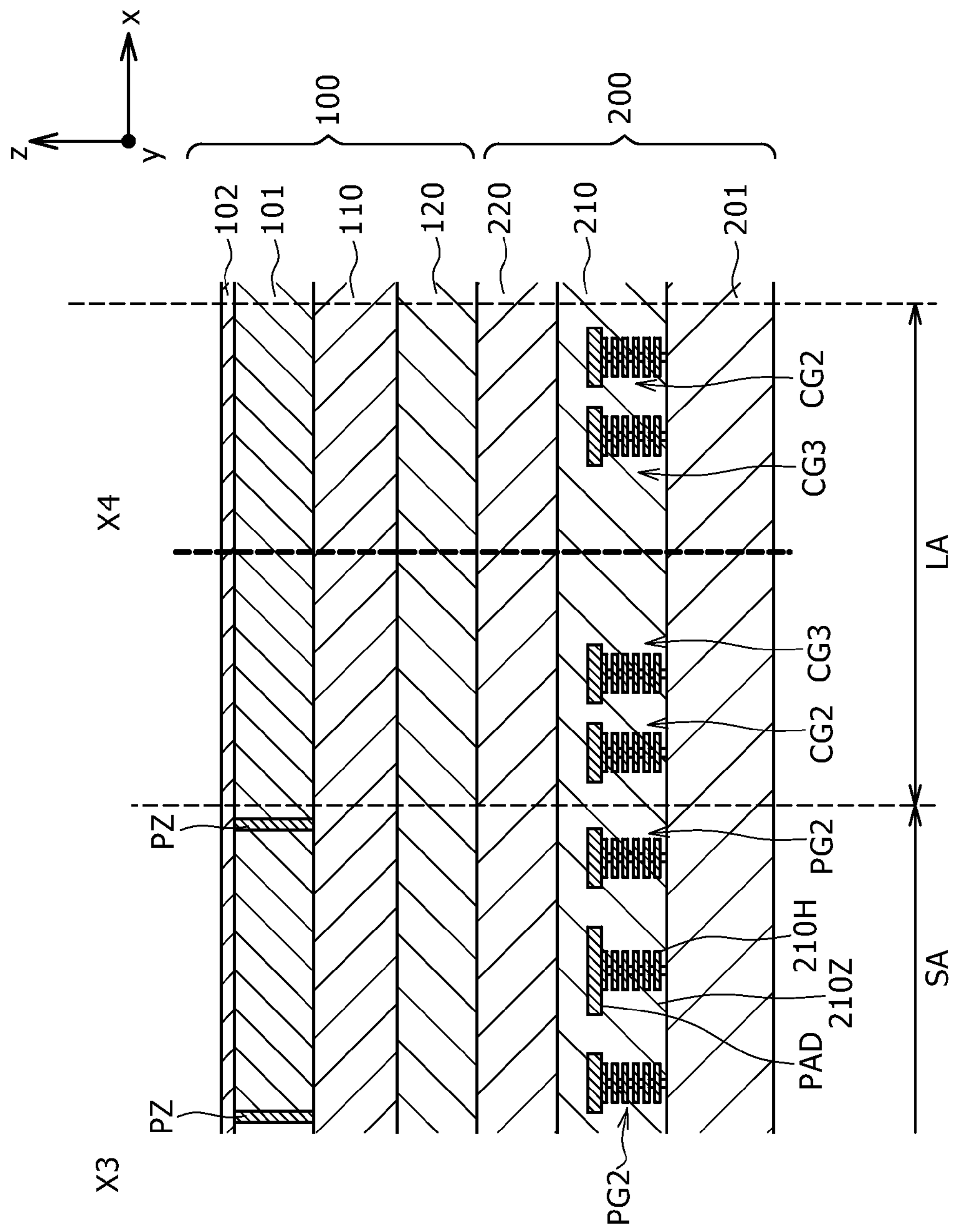
FIG. 9A is a diagram illustrating the manufacturing method of the solid-state imaging device according to the embodiment 1.
Figure 9B:
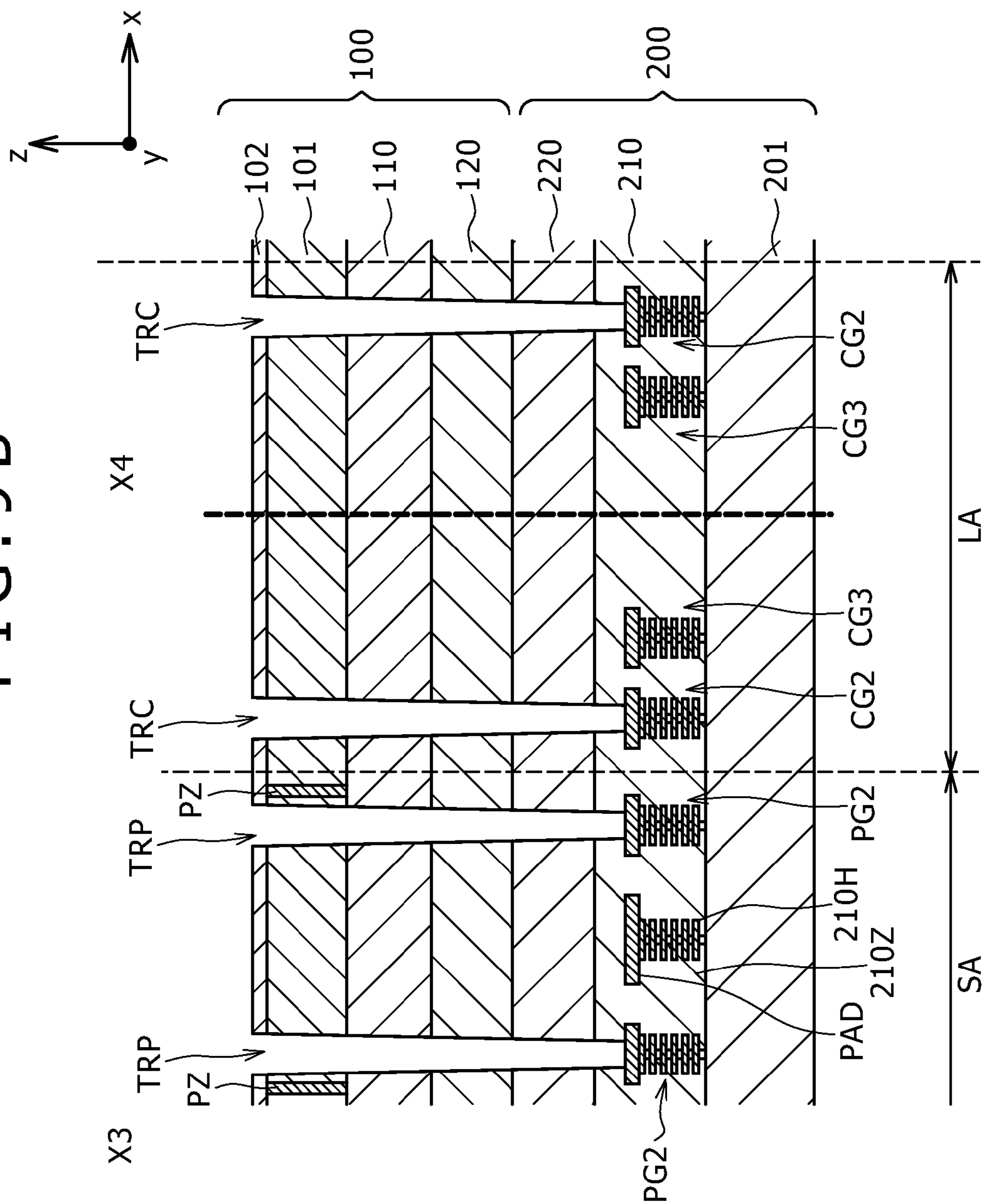
FIG. 9B is a diagram illustrating the manufacturing method of the solid-state imaging device according to the embodiment 1.
Figure 9C:
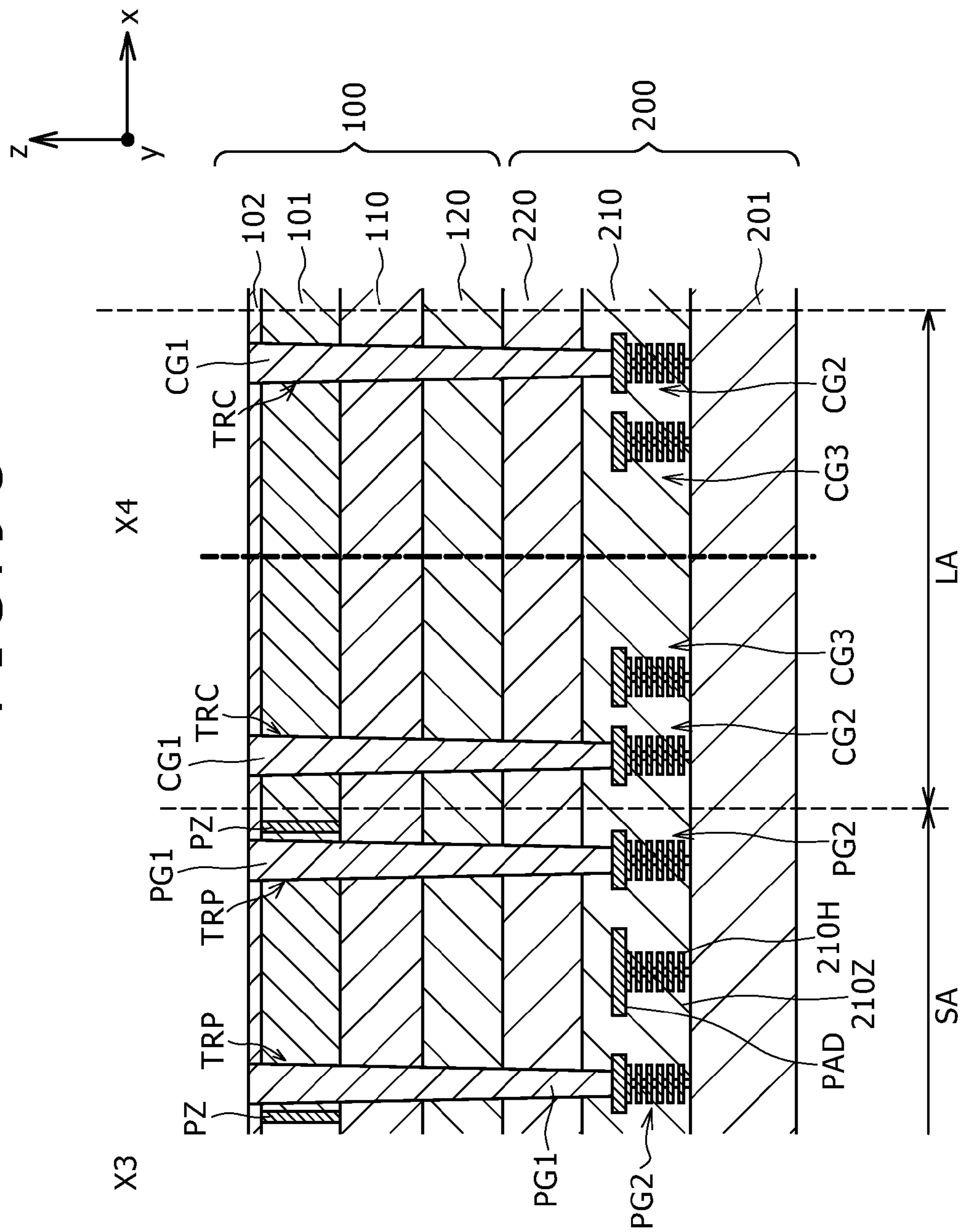
FIG. 9C is a diagram illustrating the manufacturing method of the solid-state imaging device according to the embodiment 1.
Figure 9D:
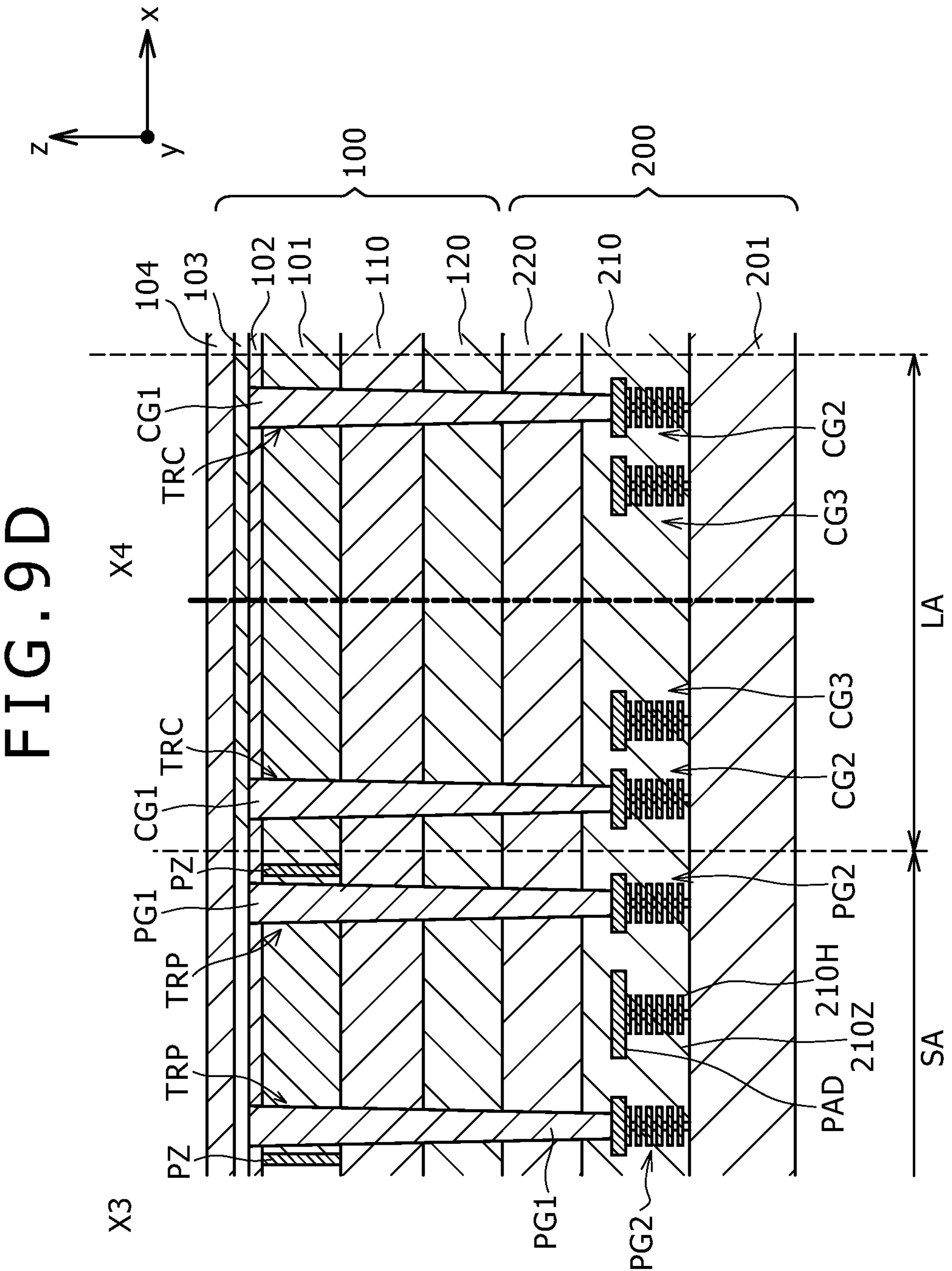
FIG. 9D is a diagram illustrating the manufacturing method of the solid-state imaging device according to the embodiment 1.
Figure 9E:
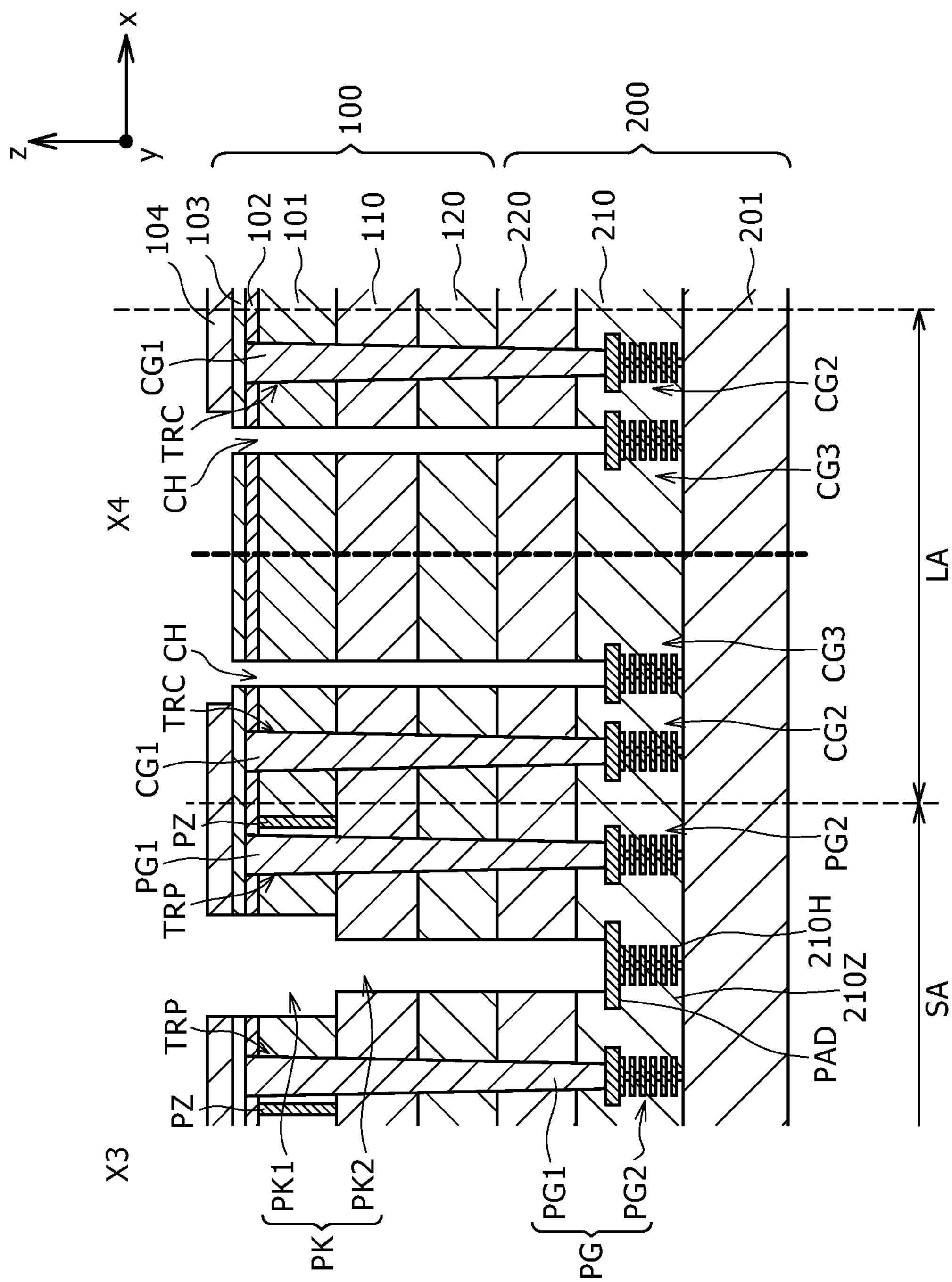
FIG. 9E is a diagram illustrating the manufacturing method of the solid-state imaging device according to the embodiment 1.

FIGS. 8 to 9E illustrate the manufacturing method of the solid-state imaging device 1 according to the embodiment 1.

Here, FIG. 8 illustrates the top surface of the semiconductor substrate 101 before being diced into the solid-state imaging devices 1.

FIGS. 9A to 9E illustrate cross-sectional views along with the line X3-X4 as does FIG. 6, illustrating cross-sectional views of the scribing area LA of another solid-state imaging device provided on the immediate right before dicing.

In the present embodiment, the plurality of solid-state imaging devices 1 are formed side by side on the surface (xy plane) of the large-sized disk-shaped semiconductor substrate 101 as illustrated in FIG. 8. Here, the plurality of solid-state imaging devices 1 are formed by carrying out steps (a) to (e) in FIG. 9A to 9E. That is, the plurality of solid-state imaging devices 1 are provided on the surface of the semiconductor wafer as semiconductor chips.

Then, the wafer is diced with a blade (not shown) along the scribing area LA provided in a linear form around each of the solid-state imaging devices 1, thus dividing the wafer into the plurality of individual solid-state imaging devices 1. As a result, the solid-state imaging device 1 as illustrated in FIG. 4 is manufactured.

A description will be given one by one of the steps for manufacturing the solid-state imaging device 1.

(a) Attachment and Others

First, the semiconductor substrate 101 of the sensor element 100 and the semiconductor substrate 201 of the logic element 200 are attached together as illustrated in FIG. 9A.

Prior to the attachment, the interconnect layer 210 and the insulating layer 220 are provided in this order on the front surface (top surface) of the semiconductor substrate 201 making up the logic element 200 as illustrated in FIG. 9A.

Here, semiconductor circuit elements (not shown) are provided on the front surface (top surface) of the semiconductor substrate 201 making up the logic element 200. Then, the interconnect layer 210 is provided in such a manner as to entirely cover the front surface (top surface) of the semiconductor substrate 201 on which the semiconductor circuit elements (not shown) are provided.

In order to form the interconnect layer 210 making up the logic element 200, the pad electrode PAD and the second pad periphery guard ring PG2 are provided in the insulating layer 210Z in the surrounding area SA as illustrated in FIG. 9A.

Further, in order to form the interconnect layer 210 making up the logic element 200, the second and third chip periphery guard rings CG2 and CG3 are provided in the scribing area LA as illustrated in FIG. 9A.

In the present embodiment, each of the pad electrode PAD, the second pad periphery guard ring PG2 and the second and third chip periphery guard rings CG2 and CG3 is formed simultaneously during the formation of the interconnect layer 210. More specifically, metal films are formed in the portion where the interconnects 210H are to be formed. At the same time, metal films are also formed in the portions where each of the other sections is to be formed. Then, the metal films for the interconnects 210H and those for the other sections are patterned simultaneously.

Then, the insulating layer 220 is provided in such a manner as to entirely cover the front surface (top surface) of the interconnect layer 210 formed as described above, thus forming the logic element 200.

In addition to the logic element 200, the sections making up the sensor element 100 are formed on the semiconductor substrate 101.

In the present step, the first insulating film 102 is provided on the back surface (top surface) of the semiconductor substrate 101 making up the sensor element 100 as illustrated in FIG. 9A. Other members to be provided on or above the first insulating film 102 are not provided in the present step. That is, in the sensor element 100 shown in FIGS. 5 and 6, the second insulating film 103, the color filter CF, the on-chip lenses OCL and the lens material layer 104 are not formed in the present step.

More specifically, the pad periphery insulating ring PZ is provided in the surrounding area SA of the semiconductor substrate 101 as illustrated in FIG. 9A. The pad periphery insulating ring PZ is formed by forming a groove in the semiconductor substrate 101 and filling the groove with an insulating material.

Then, although not shown in FIG. 9A, the photodiodes 21 are provided in the pixel area PA of the semiconductor substrate 101 (refer to FIG. 5). Further, semiconductor circuit elements (not shown) such as the pixel transistor Tr (refer to FIG. 7) are provided on the front surface (bottom surface) side of the semiconductor substrate 101.

Then, the interconnect layer 110 is provided in such a manner as to entirely cover the front surface (bottom surface) of the semiconductor substrate 101 on which the semiconductor circuit elements (not shown) such as the pixel transistor Tr are provided as illustrated in FIG. 9A.

Then, the insulating layer 120 is provided in such a manner as to entirely cover the front surface (bottom surface) of the interconnect layer 110 as illustrated in FIG. 9A.

Then, the insulating layer 120 of the sensor element 100 and the insulating layer 220 of the logic element 200 are bonded together by plasma bonding as illustrated in FIG. 9A.

The semiconductor substrate 101 of the sensor element 100 and the semiconductor substrate 201 of the logic element 200 are attached together as described above.

After the attachment, the semiconductor substrate 101 making up the sensor element 100 is thinned. Here, the semiconductor substrate 101 is thinned by subjecting the back surface thereof to CMP (chemical mechanical polishing) or other removal process. The semiconductor substrate 101 is done so, for example, until the pad periphery insulating ring PZ provided in the semiconductor substrate 101 is exposed.

Then, the first insulating film 102 is provided on the back surface (top surface) of the semiconductor substrate 101 making up the sensor element 100 as illustrated in FIG. 9A.

(b) Formation of Trenches TRP and TRC

Next, the trenches TRP and TRC are formed as illustrated in FIG. 9B.

Here, the trenches TRP are formed where the first pad periphery guard rings PG1 (refer to FIG. 6) are to be formed in the surrounding area SA as illustrated in FIG. 9B.

More specifically, each of the trenches TRP is formed to penetrate extending from the top surface of the first insulating film 102 of the sensor element 100 to the top surface of the second pad periphery guard ring PG2 as illustrated in FIG. 9B. That is, the trench TRP is formed to penetrate the semiconductor substrate 101, the first insulating film 102, the interconnect layer 110 and the insulating layer 120 of the sensor element 100, as well as the insulating layer 220 and an upper portion of the interconnect layer 210, above the second pad periphery guard ring PG2, of the logic element 200.

In addition to the trenches TRP, the trenches TRC are formed where the first chip periphery guard rings CG1 (refer to FIG. 6) are to be formed in the scribing area LA as illustrated in FIG. 9B.

More specifically, each of the trenches TRC is formed to penetrate extending from the top surface of the first insulating film 102 of the sensor element 100 to the top surface of the second chip periphery guard ring CG2 as illustrated in FIG. 9B. That is, the trench TRC is formed to penetrate the semiconductor substrate 101, the first insulating film 102, the interconnect layer 110 and the insulating layer 120 of the sensor element 100, as well as the insulating layer 220 and an upper portion of the interconnect layer 210, above the second chip periphery guard ring CG2, of the logic element 200.

In the present embodiment, the trenches TRP and TRC are formed at the same time. Here, each of the trenches TRP and TRC is formed to narrow from top to bottom in the depth direction z. That is, the trenches TRP and TRC are formed to have a taper cross-section in the depth direction z.

In the present step, a photoresist film (not shown) is formed to cover the top surface of the first insulating film 102 first, followed by patterning of the photoresist film (not shown), thus forming a resist pattern (not shown). The resist pattern is formed in such a manner that the portions where the trenches TRP and TRC are to be formed are exposed, and that other portions are covered on the top surface of the first insulating film 102. Then, each section such as the first insulating film 102 is etched using the resist pattern (not shown) as a mask, thus forming the trenches TRP and TRC.

The trenches TRP and TRC should preferably be formed as follows:

(Trenches TRP and TRC)

Width: 1 to 4 μm

Depth: 10 μm (c) Formation of First Pad Periphery Guard Rings PG1 and First Chip Periphery Guard Rings CG1

Next, the first pad periphery guard rings PG1 and the first chip periphery guard rings CG1 are formed as illustrated in FIG. 9C.

Here, each of the first pad periphery guard rings PG1 and the first chip periphery guard rings CG1 is formed by filling the trench TRP or TRC formed in the above step with a metal conductive material as illustrated in FIG. 9C.

More specifically, each of the first pad periphery guard rings PG1 is formed by filling the trench TRP above the second pad periphery guard ring PG2 with a metal conductive material as illustrated in FIG. 9C. Each of the first chip periphery guard rings CG1 is formed by filling the trench TRC above the second chip periphery guard ring CG2 with a metal conductive material.

In the present embodiment, the first pad periphery guard rings PG1 and the first chip periphery guard rings CG1 are formed at the same time.

In the present step, for example, a Cu (copper) film is formed by electroplating in such a manner that copper is filled into the trenches TRP and TRC. For example, electroplating is performed with a current of 10 A or less to form a copper film. As illustrated in FIG. 9C, this allows for the first pad periphery guard rings PG1 and the first chip periphery guard rings CG1 to be formed to narrow from top to bottom in the depth direction z. That is, the first pad periphery guard rings PG1 and the first chip periphery guard rings CG1 are formed to have a taper cross-section in the depth direction z.

(d) Formation of Second Insulating Film 103 and Lens Material Layer 104

Next, the second insulating film 103 and the lens material layer 104 are formed as illustrated in FIG. 9D.

Here, the second insulating film 103 is provided to cover the top surface of the first insulating film 102 as illustrated in FIG. 9D.

Then, the lens material layer 104 is provided to cover the top surface of the second insulating film 103 as illustrated in FIG. 9D.

Although not shown in FIG. 9D, the second insulating film 103 and the lens material layer 104 are also formed in the pixel area PA.

In the pixel area PA, the color filter CF is formed after the formation of the second insulating film 103 and prior to the formation of the lens material layer 104 as illustrated in FIG. 5. Further, after the formation of the lens material layer 104, the lens material layer 104 is shaped to form the on-chip lenses OCL.

The second insulating film 103 is formed with a low-dielectric insulating material such as SiC to serve as an anti-copper diffusion film adapted to prevent the diffusion of the copper component of the first pad periphery guard rings PG1 and the first chip periphery guard rings CG1.

Further, the lens material layer 104 is provided to cover the portion where the first chip periphery guard rings CG1 and the first pad periphery guard rings PG1 are provided on the top surface of the sensor element 100 so that the lens material layer 104 serves also as an anti-copper diffusion film.

(e) Formation of Pad Openings PK and Chip Periphery Hole Ring CH

Next, the pad openings PK and the chip periphery hole ring CH are formed as illustrated in FIG. 9E.

Here, the pad openings PK are formed in the surrounding area SA in such a manner that the top surface of the pad electrode PAD is exposed as illustrated in FIG. 9E.

In order to form each of the pad openings PK, the first pad opening PK1 is formed first.

The first pad opening PK1 is formed by etching to remove the portions of the semiconductor substrate 101, the first and second insulating films 102 and 103 and the lens material layer 104 of the sensor element 100, where the first pad opening PK1 is to be formed, as illustrated in FIG. 9E.

Then, the second pad opening PK2 is formed.

The second pad opening PK2 is formed by etching to remove the portions of the interconnect layer 110 and the insulating layer 120 of the sensor element 100 as well as the interconnect layer 210 and the insulating layer 220 of the logic element 200, where the second pad opening PK2 is to be formed.

In the present step, in addition to the pad openings PK, the chip periphery hole ring CH is provided in the scribing area LA as illustrated in FIG. 9E.

In order to form the chip periphery hole ring CH, the lens material layer 104 is removed from the area including the portion where the chip periphery hole ring CH is to be formed on the top surface of the second insulating film 103 as illustrated in FIG. 9E.

More specifically, the lens material layer 104 is left unremoved where the first chip periphery guard ring CG1 is provided, in the portion close to the surrounding area SA, in the scribing area LA. On the other hand, the lens material layer 104 is removed from where the chip periphery hole ring CH is to be formed in the portion far from the surrounding area SA. Further, the lens material layer 104 is removed from the portion to be diced (portion indicated by a bold dashed line) in the scribing area LA.

Then, the portions of the semiconductor substrate 101, the first and second insulating films 102 and 103, the interconnect layer 110 and the insulating layer 120 of the sensor element 100 as well as those of the insulating layer 220 and the interconnect layer 210 of the logic element 200 where the chip periphery hole ring CH is to be formed are removed. This is accomplished, for example, by etching. As a result, the chip periphery hole ring CH is formed.

In each of the above steps, alignment is performed, for example, using the pad periphery insulating ring PZ as an alignment mark.

As a result, the plurality of solid-state imaging devices 1 are formed on the surface (xy plane) of the disk-shaped semiconductor substrate 101 as illustrated in FIG. 8.

(f) Dicing

Next, the wafer is diced into the plurality of solid-state imaging devices 1 as illustrated in FIG. 6.

Here, as illustrated in FIG. 8, the wafer is diced with a blade (not shown) along the scribing area LA provided in a linear form around each of the solid-state imaging devices 1, thus dividing the wafer into the plurality of solid-state imaging devices 1. That is, the large-sized disk-shaped semiconductor wafer (e.g., the semiconductor substrate 101) having the plurality of solid-state imaging devices 1 formed thereon as semiconductor chips is cut into the plurality of semiconductor chips.

More specifically, in the scribing area LA of the semiconductor wafer (i.e., the semiconductor substrate 101) prior to the dicing, dicing is conducted along the portion (portion indicated by a bold dashed line) between the chip periphery guard rings CG of the plurality of solid-state imaging devices 1, as illustrated in FIG. 9E.

This completes the manufacture of the solid-state imaging device 1.

[C] Conclusion

As described above, in the present embodiment, the solid-state imaging device 1 includes the chip area CA. The chip area CA includes the pixel area PA and the surrounding area SA located around the pixel area PA. The scribing area LA is provided to surround the chip area CA (refer to FIG. 4).

The solid-state imaging device 1 includes the sensor element 100 and the logic element 200. The logic element 200 is attached to the sensor element 100 in such a manner as to be stacked on the sensor element 100 face-to-face, and is provided with the pad electrode PAD. In the solid-state imaging device 1 made up of a stacked body of the sensor element 100 and the logic element 200, the pad openings PK is provided above the top surface of the pad electrode PAD facing the sensor element 100. Further, in the solid-state imaging device 1 made up of the stacked body, each of the first pad periphery guard rings PG1 is provided to surround the side portion of the pad opening PK (refer to FIG. 6).

In addition to the above, in the solid-state imaging device 1 made up of the stacked body, a trench as the chip periphery hole ring CH is provided to surround the chip area CA, i.e., provided in the portion more inward toward the chip area CA than the portion to be diced in the scribing area LA. Moreover, in the scribing area L, the first chip periphery guard ring CG1 is provided in the portion closer to the chip area CA than the portion where the chip periphery hole ring CH is provided (refer to FIG. 6).

Accordingly, the present embodiment contributes to improved reliability and product yield as described below.

Figure 10:
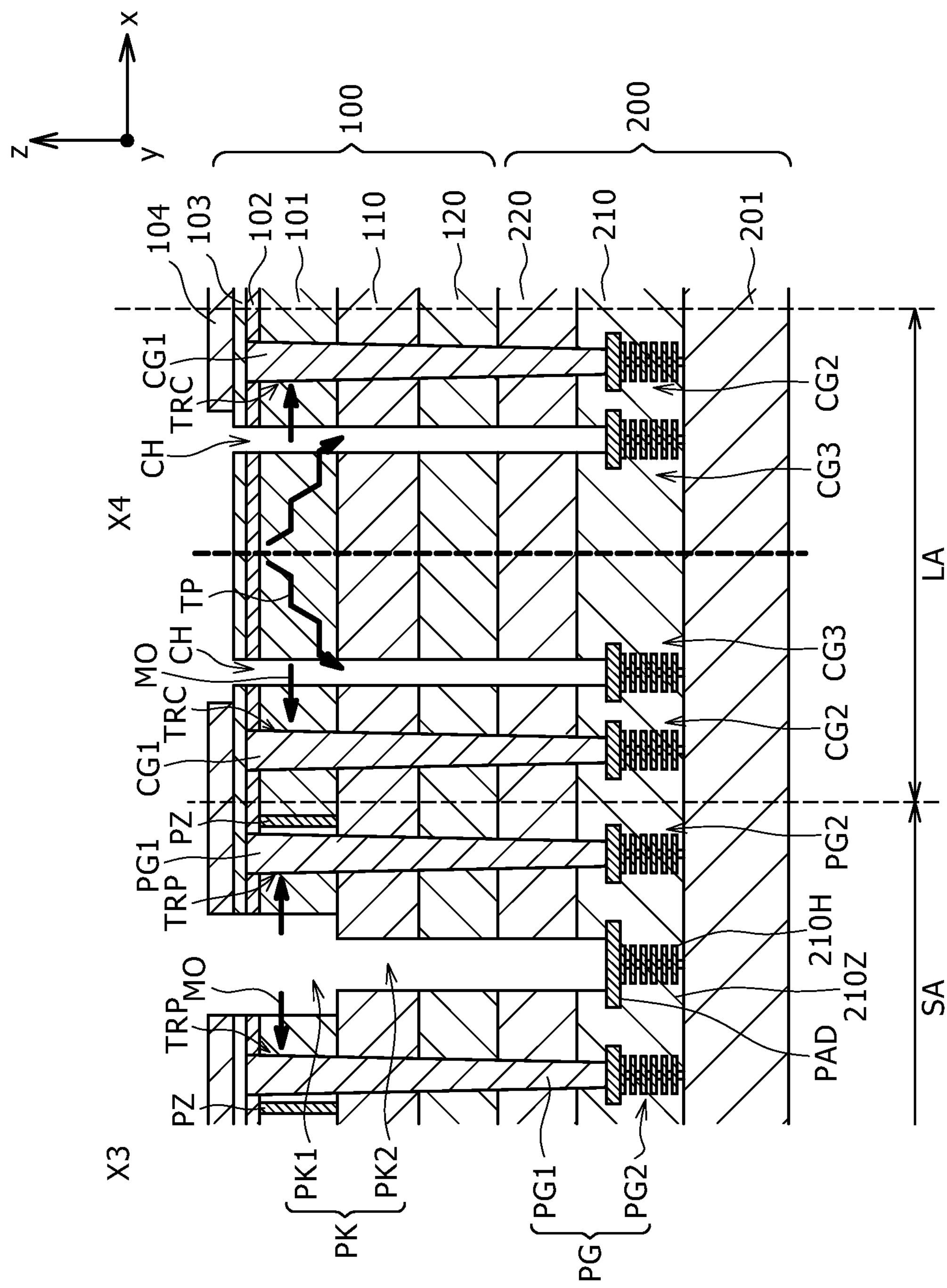
FIG. 10 is a diagram illustrating an action and effect of the solid-state imaging device according to the embodiment 1.

FIG. 10 illustrates actions and effects of the solid-state imaging device according to the embodiment 1.

FIG. 10 is a cross-sectional view as is FIG. 9E illustrating the condition of the solid-state imaging device before dicing.

As illustrated in FIG. 10, moisture MO may enter from the inner surface of the pad opening PK in the surrounding area SA.

In the present embodiment, however, the first pad periphery guard ring PG1 is provided on the side of the pad opening PK.

The first pad periphery guard ring PG1 is formed by integrally filling the entire trench TRP with a metal material on the side of the pad opening PK. The trench TRP is provided to be at least as deep as the pad opening PK. That is, the first pad periphery guard ring PG1 is not formed on the side of the pad opening PK in such a manner that a plurality of layers are stacked one on top of the other in the depth direction z. As a result, there are no connecting portions.

Further, the first pad periphery guard ring PG1 is formed to penetrate at least the semiconductor substrate 101 of the sensor element 100 to which the semiconductor substrate 201 of the logic element 200 is attached. Still further, the first pad periphery guard ring PG1 is formed to penetrate the junction surface at which the sensor element 100 and the logic element 200 are joined together face-to-face.

In the present embodiment, therefore, the first pad periphery guard ring PG1 effectively prevents moisture from entering into the pixel area PA from the inner surface of the pad opening PK.

Moreover, the first pad periphery guard ring PG1 is covered with an insulating material in the portion where it faces the side surface of the pad opening PK (refer to FIG. 10). This prevents short circuits on the side wall of the first pad periphery guard ring PG1.

As illustrated in FIG. 10, when the wafer is diced by bringing a blade (not shown) in contact with the scribing area LA, chipping TP propagates from the diced portion (portion indicated by a bold dashed line) toward the chip area CA (including the surrounding area SA). In the present embodiment, however, the chip periphery hole ring CH is provided in a portion more inward toward the chip area CA than the portion to be diced. Therefore, the chip periphery hole ring CH, i.e., a trench, prevents the chipping TP from propagating from the scribing area LA to the chip area CA.

The moisture MO may enter from the inner surface of the chip periphery hole ring CH, i.e., a trench, in the surrounding area SA as illustrated in FIG. 10.

In the present embodiment, however, the chip periphery guard ring CG is provided in the scribing area LA as illustrated in FIG. 10.

The chip periphery guard ring CG is provided between the chip periphery hole ring CH and the chip area CA (including the surrounding area SA). Here, the chip periphery guard ring CG has the first chip periphery guard ring CG1 formed by integrally filling the entire trench TRC with a metal material on the side of the chip periphery hole ring CH. The trench TRC is provided to be as deep as the chip periphery hole ring CH. That is, the first chip periphery guard ring CG1 is not formed on the side of the chip periphery hole ring CH in such a manner that a plurality of metal layers are stacked one on top of the other in the depth direction z. As a result, there are no connecting portions.

Further, the first chip periphery guard ring CG1 is formed to penetrate at least the semiconductor substrate 101 of the sensor element 100 to which the semiconductor substrate 201 of the logic element 200 is attached. The first chip periphery guard ring CG1 is formed to penetrate the junction surface at which the sensor element 100 and the logic element 200 are joined together face-to-face.

In the present embodiment, therefore, the first chip periphery guard ring CG1 effectively prevents moisture from entering into the chip area CA from the inner surface of the chip periphery hole ring CH.

If the guard ring is formed by connecting a plurality of metal films, and if chipping reaches the connecting portions thereof, the connecting portions may break apart, making it difficult to stop the progress of chipping. In the present embodiment, however, the first chip periphery guard ring CG1 has no connecting portions as described above. Therefore, the present embodiment can also effectively prevent the progress of chipping.

In addition to the above, the lens material layer 104 made of an organic resin film is provided as an anti-copper diffusion layer to cover the top surfaces of the first pad periphery guard ring PG1 and the first chip periphery guard ring CG1, each made of copper (Cu), in the present embodiment. This makes it possible to suitably prevent the diffusion of copper (Cu).

Therefore, the present embodiment contributes to improved reliability and product yield.

The first chip periphery guard ring CG1 and the first pad periphery guard ring PG1 are formed at the same time in the present embodiment. That is, the trench TRC is formed where the first chip periphery guard ring CG1 is to be formed simultaneously with the formation of the trench TRP where the first pad periphery guard ring PG1 is to be formed. Then, the trenches TRP and TRC are filled with the same metal material at the same time.

This allows for the first pad periphery guard ring PG1 and the first chip periphery guard ring CG1 to be formed at the same time in the same step.

In addition to the above, an organic material film is formed as the lens material layer 104 to cover the portions where the on-chip lenses OCL are to be formed on the top surface of the semiconductor substrate 101 in the present embodiment. At this time, the lens material layer 104 made of an organic resin film is formed to also cover the top surfaces of the first pad periphery guard ring PG1 and the first chip periphery guard ring CG1.

Therefore, the present embodiment ensures high manufacturing efficiency.

2. Embodiment 2

[A] Device Configuration and Others

Figure 11:
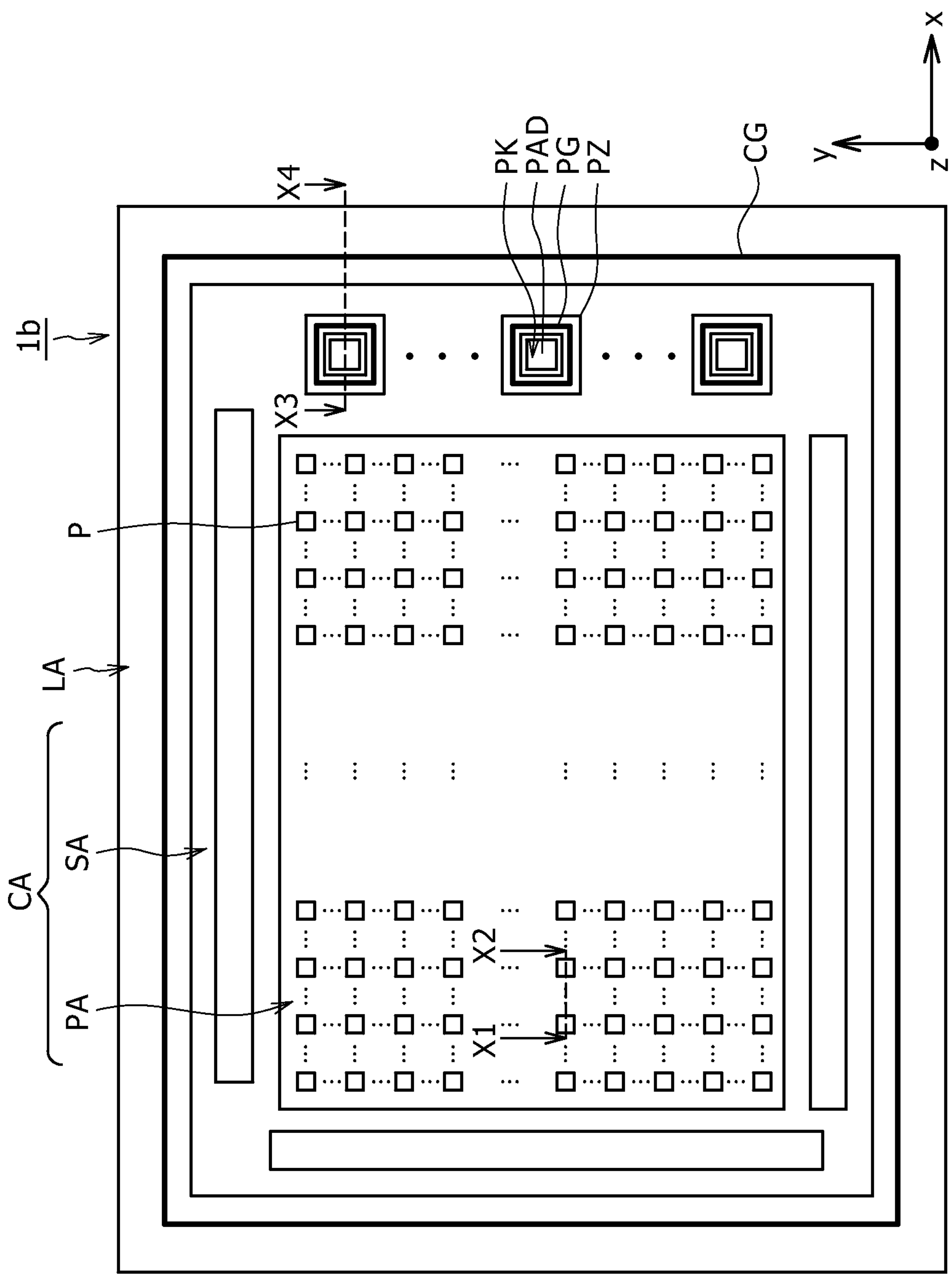
FIG. 11 is a diagram illustrating a configuration of major components of a solid-state imaging device according to an embodiment 2.
Figure 12:
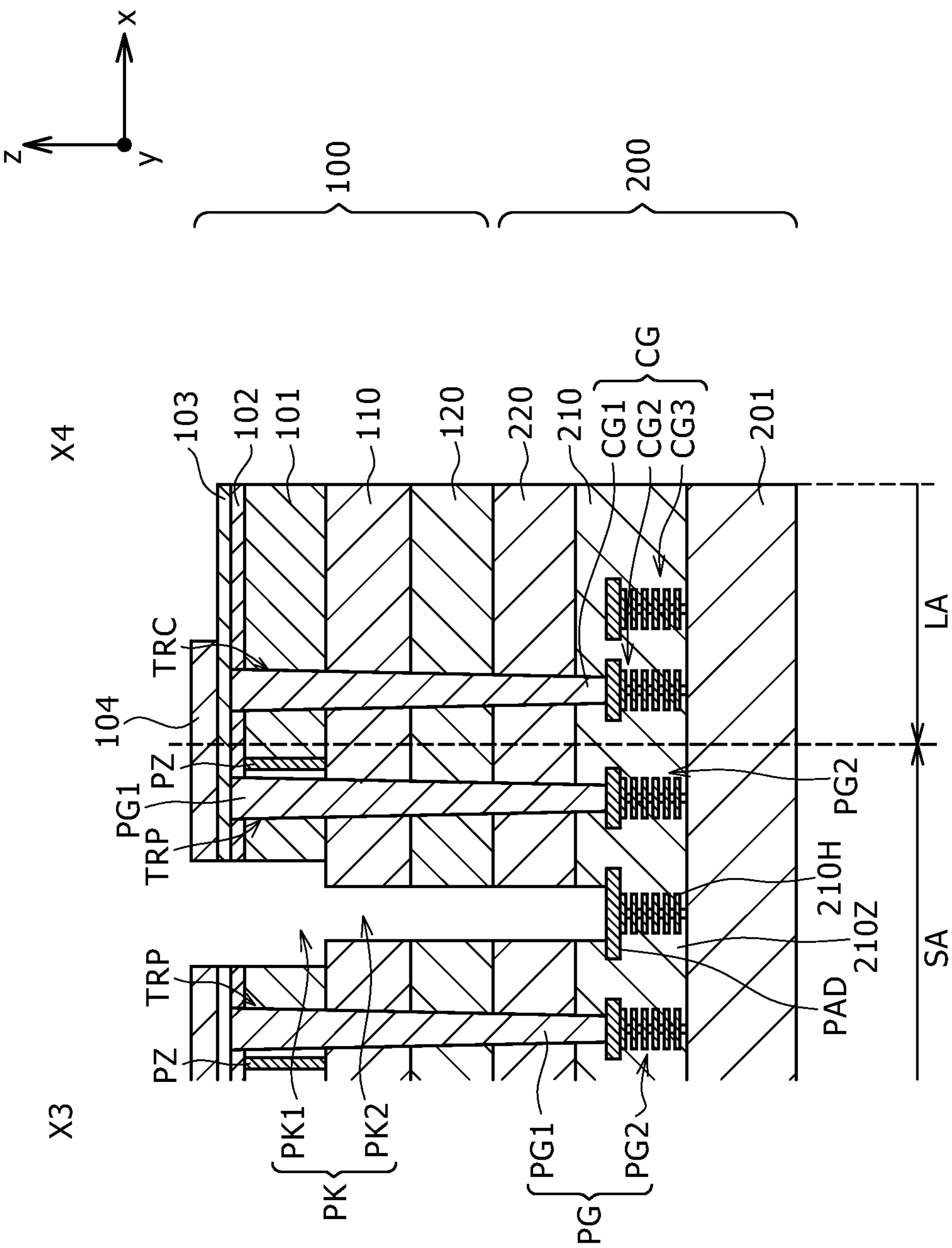
FIG. 12 is a diagram illustrating a configuration of the major components of the solid-state imaging device according to the embodiment 2.
Figure 13:
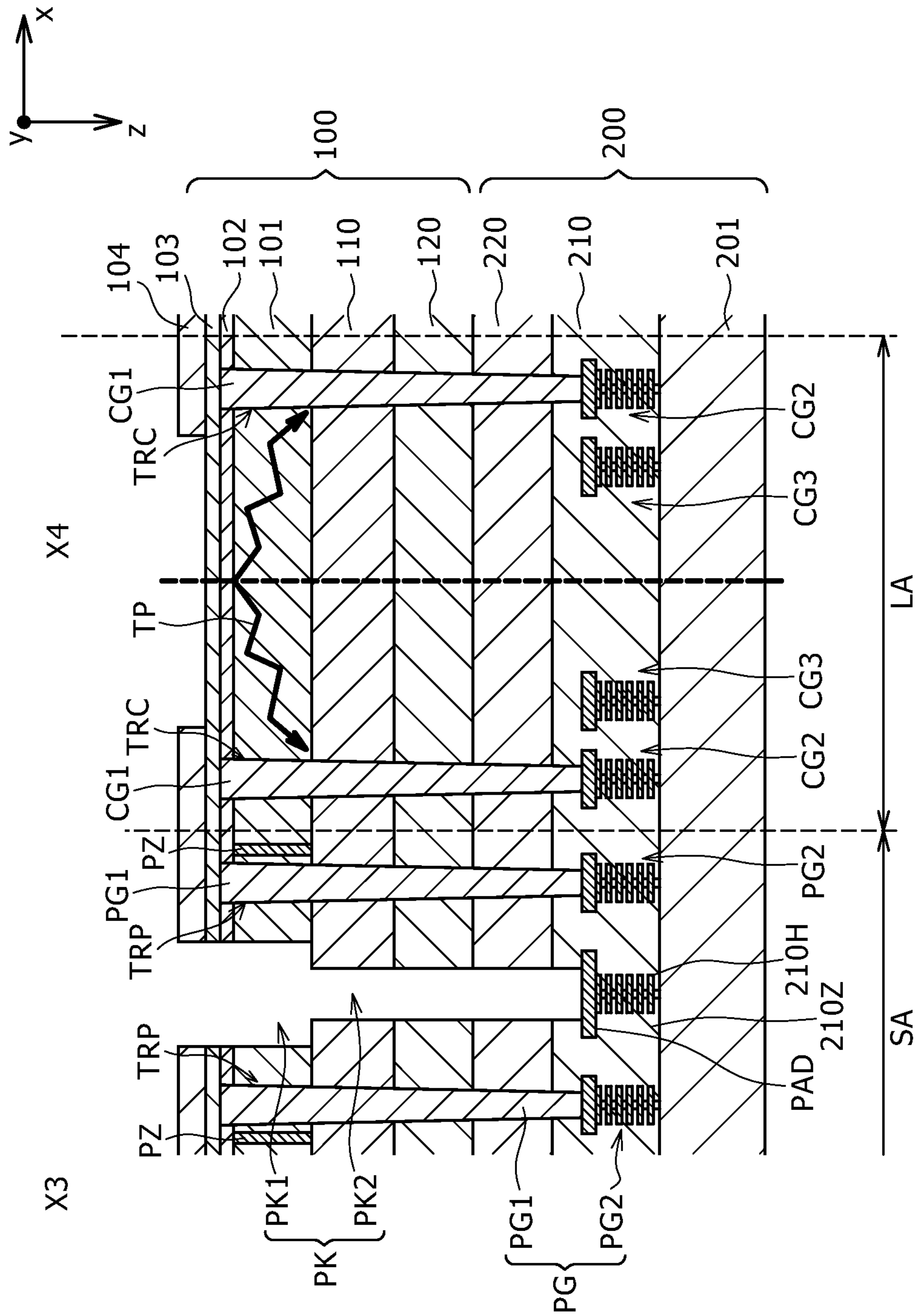
FIG. 13 is a diagram illustrating a configuration of the major components of the solid-state imaging device according to the embodiment 2.

FIGS. 11 to 13 are diagrams illustrating the configuration of major components of a solid-state imaging device according to an embodiment 2.

Here, FIG. 11 is a top view as is FIG. 4 illustrating the side of the sensor element 100.

FIG. 12 is a cross-sectional view along the line X3-X4 shown in FIG. 11 as is FIG. 6, illustrating the surrounding area SA and the scribing area LA.

FIG. 13 is a cross-sectional view as is FIG. 10, illustrating the condition before dicing.

As illustrated in FIGS. 11 to 13, the chip periphery hole ring CH (refer to FIG. 4 or other figures) is not provided in a solid-state imaging device 1*b* according to the present embodiment. The present embodiment is identical to the embodiment 1 except in this and other related points. Therefore, the redundant description will be omitted.

When the wafer is diced with a blade (not shown) along the scribing area LA, the chipping TP occurs in the diced portion (portion indicated by a bold dashed line) and propagates toward the chip area CA (including the surrounding area SA) as illustrated in FIG. 13.

In the present embodiment, however, the chip periphery guard ring CG is provided in a portion more inward toward the chip area CA than the diced portion.

The chip periphery guard ring CG is made of a material different in properties such as hardness and modulus of rigidity from the portions located around the semiconductor substrate 101, the insulating layer and the like as described above. In the present embodiment, the chip periphery guard ring CG is made, for example, of a metal material such as copper (Cu). This allows for the chip periphery guard ring CG to prevent the chipping TP from propagating to the chip area CA from the scribing area LA.

[B] Conclusion

As described above, the present embodiment contributes to improved reliability and product yield as does the embodiment 1.

3. Others

The embodiments are not limited to those described above but may be modified in various ways.

Although a case has been described in the above embodiments in which the sensor element 100 and the logic element 200 are bonded together by plasma bonding, the present technology is not limited thereto. For example, the two elements may be attached together with an adhesive.

In the above embodiments, the pad openings PK are each formed by stacking the first and second pad openings PK1 and PK2 one on top of the other in the depth direction z. However, the present technology is not limited thereto. In addition to the formation of two levels, i.e., the first and second pad openings PK1 and PK2, the pad opening PK may be formed by stacking three or more levels. Alternatively, the pad opening PK may be formed to have no difference in level.

In the above embodiments, the trench TRP is formed where the first pad periphery guard ring PG1 is to be formed, simultaneously with the formation of the trench TRC where the first chip periphery guard ring CG1 is to be formed. However, the present technology is not limited thereto. These sections may be formed separately from each other. In addition to the above, the pad openings PK may be formed in the same step as and simultaneously with the formation of the trenches TRP and TRC.

In the above embodiments, the first pad periphery guard ring PG1 and the first chip periphery guard ring CG1 are formed at the same time by filling the trenches TRP and TRC with the same metal material at the same time, respectively. However, the present technology is not limited thereto. The first pad periphery guard ring PG1 and the first chip periphery guard ring CG1 may be formed separately.

In the above embodiments, a case has been described in which both the first pad periphery guard ring PG1 and the first chip periphery guard ring CG1 are provided in the solid-state imaging device. However, the present technology is not limited thereto. It may be also possible to provide only one of the first pad periphery guard ring PG1 and the first chip periphery guard ring CG1.

In the above embodiments, a case has been described in which the first pad periphery guard ring PG1 is formed as deep as the pad opening PK. However, the present technology is not limited thereto. The first pad periphery guard ring PG1 may be formed deeper than the pad opening PK. At this time, it is not necessary to provide the second pad periphery guard ring PG2 under the first pad periphery guard ring PG1.

In the above embodiments, a case has been described in which the first chip periphery guard ring CG1 is formed as deep as the chip periphery hole ring CH. However, the present technology is not limited thereto. The first chip periphery guard ring CG1 may be formed deeper than the chip periphery hole ring CH. At this time, it is not necessary to provide the second chip periphery guard ring CG2 under the first chip periphery guard ring CG1.

In the above embodiments, a case has been described in which the pad periphery insulating ring PZ is provided as an alignment mark. However, the present technology is not limited thereto. Other alignment marks may be provided.

In the above embodiments, a case has been described in which the sensor element 100, i.e., a back-illuminated CMOS image sensor, is manufactured from a silicon substrate. However, the present technology is not limited thereto. The sensor element 100 may be manufactured from a so-called SOI (Silicon on Insulator) substrate.

In the above embodiments, a case has been described in which four transistors, i.e., a transfer transistor, an amplifying transistor, a selection transistor and a reset transistor, are provided in each of the pixel transistors. However, the present technology is not limited thereto. The present technology may be applied when three transistors, i.e., a transfer transistor, an amplifying transistor and a reset transistor, are provided in each of the pixel transistors.

In the above embodiments, a case has been described in which a transfer transistor, an amplifying transistor, a selection transistor and a reset transistor are provided for each photodiode. However, the present technology is not limited thereto. The present technology may be applied when an amplifying transistor, a selection transistor and a reset transistor are provided for a plurality of photodiodes.

In the above embodiments, a case has been described in which the present technology is applied to a camera. However, the present technology is not limited thereto. The present technology may be applied to other pieces of electronic equipment having a solid-state imaging device such as a scanner or a copier.

In the above embodiments, a case has been described in which the sensor element 100 is a "back-illuminated" CMOS image sensor. However, the present technology is not limited thereto. The present technology may be applied when the sensor element 100 is a "front-illuminated" CMOS image sensor. Further, the present technology may be applied when the sensor element 100 is a CCD image sensor rather than a CMOS image sensor.

In the above embodiments, a case has been described in which the sensor element 100 and the logic element 200 are attached together. However, the present technology is not limited thereto. The present technology may be applied when semiconductor chips other than the sensor element 100 and the logic element 200 are attached together.

In addition to the above, the above embodiments may be combined as appropriate.

That is, the present technology may have one of the following configurations.

(1)

A solid-state imaging device including:

a sensor element having a plurality of pixels each including a photoelectric conversion section; and a logic element having a pad electrode and attached to the sensor element in such a manner as to be stacked on the sensor element face-to-face, in which in a stacked body of the sensor and logic elements, a pad opening is provided above the top surface of the pad electrode facing the sensor element, and a pad periphery guard ring is provided to surround the side portion of the pad opening, and the pad periphery guard ring is formed by integrally filling, on the side of the pad opening, the entire trench that is at least as deep as the pad opening with a metal material.

(2)

The solid-state imaging device according to the above (1), in which the pad periphery guard ring is formed to narrow from top to bottom.

(3)

The solid-state imaging device according to the above (1) or (2), in which the pad periphery guard ring is made of copper, and the sensor element has an organic resin film provided on the top surface to cover the portion where the pad periphery guard ring is provided.

(4)

The solid-state imaging device according to any one of the above (1) to (3), in which the sensor element includes a first semiconductor substrate that has a first interconnect layer on the bottom surface facing the logic element, the logic element includes a second semiconductor substrate that has a second interconnect layer on the top surface facing the sensor element, the pad electrode is provided in the second interconnect layer, and each of the pad opening and the pad periphery guard ring is provided to penetrate at least the first semiconductor substrate and the first interconnect layer.

(5)

The solid-state imaging device according to the above (1), in which the stacked body of the sensor and logic elements includes, in the direction of the surfaces of the sensor and logic elements faced to each other:

a chip area including a pixel area where the plurality of pixels are arranged, and a scribing area located around the chip area, a trench is provided as a chip periphery hole ring closer to the chip area than the portion to be diced in the scribing area, a chip periphery guard ring is provided closer to the chip area than the portion where the chip periphery hole ring is provided in the scribing area, and the chip periphery guard ring is formed by integrally filling, on the side of the chip periphery hole ring, the entire trench that is at least as deep as the chip periphery hole ring with a metal material.

(6)

The solid-state imaging device according to the above (5), in which the chip periphery guard ring is formed to narrow from top to bottom.

(7)

The solid-state imaging device according to the above (5) or (6), in which the chip periphery guard ring is made of copper, and the sensor element has an organic resin film provided on the top surface to cover the portion where the chip periphery guard ring is provided.

(8)

The solid-state imaging device according to any one of the above (5) to (7), in which the sensor element includes a first semiconductor substrate that has a first interconnect layer on the bottom surface facing the logic element, the logic element includes a second semiconductor substrate that has a second interconnect layer on the top surface facing the sensor element, and each of the chip periphery hole ring and the chip periphery guard ring is provided to penetrate at least the first semiconductor substrate and the first interconnect layer.

(9)

The solid-state imaging device according to the above (3) or (7), in which the sensor element has on-chip lenses provided on the top surface side of the first semiconductor substrate, one for each of the plurality of pixels, the on-chip lenses adapted to focus light on the light-receiving surface of the photoelectric conversion section, and the on-chip lenses are formed by shaping the organic resin film provided to cover the portion where the on-chip lenses are formed on the top surface of the first semiconductor substrate.

(10)

An electronic equipment including:

a sensor element having a plurality of pixels each having a photoelectric conversion section; and a logic element having a pad electrode and attached to the sensor element in such a manner as to be stacked on the sensor element face-to-face, in which in a stacked body of the sensor and logic elements, a pad opening is provided above the top surface of the pad electrode facing the sensor element, and a pad periphery guard ring is provided to surround the side portion of the pad opening, and the pad periphery guard ring is formed by integrally filling, on the side of the pad opening, the entire trench that is at least as deep as the pad opening with a metal material.

(11)

A semiconductor device including:

a first semiconductor chip; and a second semiconductor chip that has a pad electrode and is attached to the first semiconductor chip in such a manner as to be stacked on the first semiconductor chip face-to-face, in which in a stacked body of the first and second semiconductor chips, a pad opening is provided above the top surface of the pad electrode facing the first semiconductor chip, and a pad periphery guard ring is provided to surround the side portion of the pad opening, and the pad periphery guard ring is formed by integrally filling, on the side of the pad opening, the entire trench that is at least as deep as the pad opening with a metal material.

(12)

A manufacturing method of a solid-state imaging device including:

attaching sensor and logic elements together in such a manner that the two elements are stacked one on top of the other face-to-face, the sensor element having a plurality of pixels each of which includes a photoelectric conversion section, and the logic element having a pad electrode; and providing, in a stacked body of the sensor and logic elements, a pad periphery guard ring to surround the side portion of a pad opening provided above the top surface of the pad electrode facing the sensor element, in which in providing the pad periphery guard ring, the pad periphery guard ring is formed by integrally filling, on the side of the pad opening, the entire trench that is at least as deep as the pad opening with a metal material.

It should be noted that the above embodiments uses: the photodiode 21 as an example of the photoelectric conversion section; the camera 40 as an example of the electronic equipment; the sensor element 100 as an example of the first semiconductor chip; the logic element 200 as an example of the second semiconductor chip; the first pad periphery guard ring PG1 as an example of the pad periphery guard ring; the semiconductor substrate 101 as an example of the first semiconductor substrate; the interconnect layer 110 as an example of the first interconnect layer; the semiconductor substrate 201 as an example of the second semiconductor substrate; the interconnect layer 210 as an example of the second interconnect layer; the lens material layer 104 as an example of the organic resin film; the first chip periphery guard ring CG1 as an example of the chip periphery guard ring; and the solid-state imaging device 1 as an example of the semiconductor device.

The present disclosure contains subject matter related to that disclosed in Japanese Priority Patent Application JP 2011-041321 filed in the Japan Patent Office on Feb. 28, 2011, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A solid-state imaging device comprising:

a sensor element interconnect layer between a sensor element semiconductor substrate and a logic element interconnect layer, said logic element interconnect layer being between a logic element semiconductor substrate and said sensor element interconnect layer;

semiconductor devices in said sensor element semiconductor substrate, a chip periphery trench encircling said semiconductor devices in a top view of the solid-state imaging device;

a first metallic chip periphery guard ring in said chip periphery trench, said chip periphery trench extending though said sensor element semiconductor substrate and said sensor element interconnect layer;

a second metallic chip periphery guard ring in said logic element interconnect layer, said chip periphery trench terminating at said second metallic chip periphery guard ring;

a first metallic pad periphery guard ring in a pad periphery trench, said pad periphery trench extending though said sensor element semiconductor substrate and said sensor element interconnect layer;

a second metallic pad periphery guard ring in said logic element interconnect layer, said pad periphery trench terminating at said second metallic pad periphery guard ring.

2. The solid-state imaging device according to claim 1, wherein said chip periphery trench encircles said first metallic pad periphery guard ring in said top view of the solid-state imaging device.

3. The solid-state imaging device according to claim 1, wherein said first metallic pad periphery guard ring is copper.

4. The solid-state imaging device according to claim 1, further comprising:

a pad opening extending though said sensor element semiconductor substrate and said sensor element interconnect layer, said pad periphery trench encircling said pad opening in said top view of the solid-state imaging device.

5. The solid-state imaging device according to claim 1, wherein an on-chip lens is an organic resin film, a portion of the organic resin film covering said pad periphery guard ring.

6. The solid-state imaging device according to claim 5, wherein one of the semiconductor devices is a photodiode, said photodiode being between said on-chip lens and said sensor element interconnect layer.

7. The solid-state imaging device according to claim 6, further comprising:

a color filter between said photodiode and said on-chip lens.

8. The solid-state imaging device according to claim 6, further comprising:

electrically conductive interconnects within said sensor element interconnect layer, said photodiode being between an on-chip lens and one of the interconnects.

9. The solid-state imaging device according to claim 6, wherein said on-chip lens is configured to focus light onto a light-receiving surface of the photodiode, said photodiode being configured to photoelectrically convert said light into a signal charge.

10. The solid-state imaging device according to claim 1, wherein said first metallic chip periphery guard ring fills said chip periphery trench.

11. The solid-state imaging device according to claim 1, wherein said first metallic chip periphery guard ring touches said second metallic chip periphery guard ring.

12. The solid-state imaging device according to claim 1, wherein said first metallic chip periphery guard ring is copper.

13. The solid-state imaging device according to claim 1, further comprising:

a scribing area encircling said first metallic chip periphery guard ring in said top view of the solid-state imaging device.

14. An electronic device comprising:

the solid-state imaging device according to claim 1;

a control section configured to output control signals to said solid-state imaging device.

15. A solid-state imaging device comprising:

a sensor element interconnect layer between a sensor element semiconductor substrate and a logic element interconnect layer, said logic element interconnect layer being between a logic element semiconductor substrate and said sensor element interconnect layer;

semiconductor devices in said sensor element semiconductor substrate, a chip periphery trench encircling said semiconductor devices in a top view of the solid-state imaging device;

a first metallic chip periphery guard ring in said chip periphery trench, said chip periphery trench extending though said sensor element semiconductor substrate and said sensor element interconnect layer;

a second metallic chip periphery guard ring in said logic element interconnect layer, said chip periphery trench terminating at said second metallic chip periphery guard ring;

a first metallic pad periphery guard ring in a pad periphery trench, said pad periphery trench extending though said sensor element semiconductor substrate and said sensor element interconnect layer, a pad opening extending though said sensor element semiconductor substrate and said sensor element interconnect layer, said pad periphery trench encircling said pad opening in said top view of the solid-state imaging device, wherein said pad opening terminates in said logic element interconnect layer at a pad electrode.

16. A solid-state imaging device comprising:

a sensor element interconnect layer between a sensor element semiconductor substrate and a logic element interconnect layer, said logic element interconnect layer being between a logic element semiconductor substrate and said sensor element interconnect layer;

semiconductor devices in said sensor element semiconductor substrate, a chip periphery trench encircling said semiconductor devices in a top view of the solid-state imaging device;

a first metallic chip periphery guard ring in said chip periphery trench, said chip periphery trench extending though said sensor element semiconductor substrate and said sensor element interconnect layer;

a second metallic chip periphery guard ring in said logic element interconnect layer, said chip periphery trench terminating at said second metallic chip periphery guard ring;

a first metallic pad periphery guard ring in a pad periphery trench, said pad periphery trench extending though said sensor element semiconductor substrate and said sensor element interconnect layer, a pad opening extending though said sensor element semiconductor substrate and said sensor element interconnect layer, said pad periphery trench encircling said pad opening in said top view of the solid-state imaging device, wherein said pad opening is wider in said sensor element semiconductor substrate than in said logic element interconnect layer.

* * * * *